United States Patent
Harrington et al.

(10) Patent No.: US 9,240,798 B2
(45) Date of Patent: Jan. 19, 2016

(54) ON-CHIP ANALOG-TO-DIGITAL CONVERTER (ADC) LINEARITY TEXT FOR EMBEDDED DEVICES

(71) Applicant: TEXAS INSTRUMENTS INCORPORATED, Dallas, TX (US)

(72) Inventors: Cormac Harrington, Cork (IE); Ken Moushegian, Cary, NC (US); Andrew Alleman, Cary, NC (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 14/193,669

(22) Filed: Feb. 28, 2014

(65) Prior Publication Data
US 2015/0249458 A1    Sep. 3, 2015

(51) Int. Cl.
*H03M 1/10*    (2006.01)
*H03M 1/12*    (2006.01)

(52) U.S. Cl.
CPC .......... *H03M 1/1004* (2013.01); *H03M 1/1033* (2013.01); *H03M 1/1095* (2013.01); *H03M 1/1245* (2013.01)

(58) Field of Classification Search
CPC ....... H03M 1/109; H03M 1/12; H03M 1/144; H03M 1/164; H03M 3/388; H03M 3/458; H03M 1/069; H03M 1/1009
USPC .......................... 341/118–121, 138, 155, 128
See application file for complete search history.

(56) References Cited

U.S. PATENT DOCUMENTS

| | | | | |
|---|---|---|---|---|
| 5,319,370 A * | 6/1994 | Signore et al. | ................ | 341/120 |
| 5,659,312 A * | 8/1997 | Sunter et al. | ................... | 341/120 |
| 5,771,012 A * | 6/1998 | Shu et al. | ...................... | 341/118 |
| 5,870,042 A * | 2/1999 | Noda | ........................... | 341/120 |
| 6,140,949 A * | 10/2000 | Tsay | ................... | H03M 1/1057 341/118 |
| 7,379,831 B1 * | 5/2008 | Tsyrganovich | ................. | 702/85 |
| 7,411,532 B2 * | 8/2008 | Zanchi | ................ | H03M 1/1033 341/120 |
| 8,106,801 B2 * | 1/2012 | Dasnurkar | ............. | H03K 4/501 341/120 |
| 8,310,385 B2 * | 11/2012 | Dasnurkar | .......... | H03M 1/1095 341/120 |
| 8,682,613 B2 * | 3/2014 | Hamilton | .............. | H03M 1/109 702/180 |
| 8,723,711 B1 * | 5/2014 | Bushey | ......................... | 341/139 |
| 8,803,716 B1 * | 8/2014 | Munnan et al. | ............... | 341/120 |
| 8,947,276 B1 * | 2/2015 | Yu | ......................... | H03M 1/109 341/118 |
| 2002/0030615 A1 * | 3/2002 | Cherubal | .............. | H03M 1/109 341/120 |
| 2003/0220758 A1 * | 11/2003 | Nishimura et al. | .......... | 702/117 |
| 2005/0068210 A1 * | 3/2005 | Lin | ....................... | H03M 1/109 341/120 |

(Continued)

OTHER PUBLICATIONS

IEEE Standards for Terminology and Test Methods for Analog-to-Digital Converters, IEEE Std 1241-2000, Approved Dec. 7, 20000, IEEE-SA Standards Board (98 pages).

*Primary Examiner* — Linh Nguyen
(74) *Attorney, Agent, or Firm* — William B. Kempler; Frank D. Cimino

(57) ABSTRACT

A method for testing linearity of an ADC, comprising receiving a trigger signal indicating an ADC input voltage step adjustment, reading an ADC output sample upon receiving the trigger signal, wherein the ADC output sample has a value range of N integer values that correspond to N discrete ADC output codes, computing a histogram of code occurrences for M consecutive ADC output codes, wherein the histogram comprises M number of bins corresponding to the M consecutive ADC output codes, and wherein M is less than N, updating a DNL value and an INL value according to the histogram at an interval of K number of ADC output sample readings, and shifting the histogram by one ADC output code after updating the DNL and the INL values.

25 Claims, 12 Drawing Sheets

(56) References Cited

U.S. PATENT DOCUMENTS

| | | | |
|---|---|---|---|
| 2006/0001560 A1* | 1/2006 | Wen | 341/120 |
| 2007/0046509 A1* | 3/2007 | Zanchi et al. | 341/75 |
| 2011/0098964 A1* | 4/2011 | Mullane | H03M 1/1085 |
| 2012/0075130 A1* | 3/2012 | Zhang | 702/123 |
| 2012/0229314 A1* | 9/2012 | Asami et al. | 341/120 |
| 2014/0143624 A1* | 5/2014 | Deng | 341/118 |
| | | | H03M 1/109 |
| | | | 714/734 |

* cited by examiner

ON-CHIP ANALOG-TO-DIGITAL CONVERTER (ADC) LINEARITY TEXT FOR EMBEDDED DEVICES

CROSS-REFERENCE TO RELATED APPLICATION

None.

BACKGROUND

Analog-to-digital converters (ADCs) convert analog input signals into a sequence of digital output codes. The conversion process may involve quantization of the inputs since the analog signal is continuous, while the digital output codes are discrete. ADC measurements may deviate from ideal measurements through various sources of inaccuracy in the conversion process (e.g. quantization errors), as well as variations in manufacturing process (e.g. device-to-device variations). ADC performance may be specified in terms of static performance and dynamic performance. Static performance may include offset error, gain error, Differential Non Linearity (DNL), and Integral Non Linearity (INL). Dynamic performance may include Total Harmonic Distortion (TDH) and Signal to Noise Ratio (SNR). Some embedded devices (e.g. Digital Signal Processors (DSPs), Systems on Chip (SoCs)) may include an on-chip ADC. The performance of the on-chip ADC may be evaluated during production test.

SUMMARY

An on-chip ADC linearity test for embedded devices is disclosed herein. In one embodiment, a method for testing linearity of an ADC includes receiving a trigger signal that indicates an ADC input voltage adjustment and reading an ADC output sample upon receiving the trigger signal, wherein the ADC output sample has value in a range of N integer values that correspond to N discrete ADC output codes. The method further includes computing a histogram of code occurrences for M consecutive ADC output codes, wherein the histogram comprises M number of bins corresponding to the M consecutive ADC output codes, and wherein M is less than N. The method further includes updating a DNL value and an INL value according to the histogram at an interval of K number of ADC output sample readings. The method further includes shifting the histogram by one ADC output code after updating the DNL and the INL values.

In another embodiment, a non-transitory, computer-storage readable device comprising computer executable instructions that, when executed by a processor, causes the processor to detect a trigger event that indicates an ADC voltage step increment and read an ADC output sample upon receiving the trigger event. The ADC output sample has a value range of N integer values that correspond to N discrete ADC output codes. The instructions further cause the processor to update a histogram of code occurrences for M consecutive ADC output codes, wherein the histogram comprises M number of bins corresponding to the M consecutive ADC output codes, and wherein M is less than N. The instructions further cause the processor to update a maximum DNL value, a minimum DNL value, a maximum INL value, and a minimum INL value according to the histogram at an interval of K number of ADC output sample readings. The instructions further cause the processor to shift the histogram by one ADC output code after updating the maximum DNL value, the minimum DNL value, the maximum INL value, and the minimum INL value.

In yet another embodiment, an apparatus includes an ADC configured to convert an analog input signal into N discrete ADC output codes and a memory to include a histogram comprising M number of bins that store the number of occurrences for M consecutive ADC output codes, wherein each bin corresponds to one of the M ADC output codes, and wherein M is less than N. The apparatus further includes a first interface configured to receive a trigger signal that indicates a voltage step increment at the ADC input, wherein an average of K number of received trigger signals corresponds to an ADC output code transition. The apparatus further includes a processor coupled to the ADC, the memory, and the first interface and configured to read an ADC output sample upon receiving the trigger signal and compute the histogram by incrementing a number of occurrences in a bin corresponding to a value of the ADC sample. The processor is further configured to update a maximum code occurrences, a minimum code occurrences, a maximum INL value, and a minimum INL value according to the histogram at an interval of K ADC output sample readings, wherein the maximum code occurrences is proportional to a maximum DNL value, and wherein the minimum code occurrences is proportional to a minimum DNL value. The processor is further configured to shift the histogram by one ADC output code after updating the maximum code occurrences, the minimum code occurrences, the maximum INL value, and the minimum INL value.

In yet another embodiment, a non-transitory, computer-storage readable device comprising computer executable instructions that, when executed by a processor, causes the processor to set a first control code to instruct a voltage step increment, set a second control code to indicate the voltage step increment, and read an ADC measurement report comprising a maximum code occurrences, a minimum code occurrences, a maximum scaled INL value, and a minimum scaled INL value and the ADC codes corresponding to the maximum code occurrences, the minimum code occurrences, the maximum scaled INL value, and the minimum scaled INL value. The instructions further cause the processor to compute a maximum DNL value, a minimum DNL value, a maximum INL value, and a minimum INL value from the measurement report.

BRIEF DESCRIPTION OF THE DRAWINGS

For a detailed description of exemplary embodiments of the invention, reference will now be made to the accompanying drawings in which.

DETAILED DESCRIPTION

The following discussion is directed to various embodiments of the invention. Although one or more of these embodiments may be preferred, the embodiments disclosed should not be interpreted, or otherwise used, as limiting the scope of the disclosure, including the claims. In addition, one skilled in the art will understand that the following description has broad application, and the discussion of any embodiment is meant only to be exemplary of that embodiment, and not intended to intimate that the scope of the disclosure, including the claims, is limited to that embodiment.

An ADC input may be a continuous voltage with infinite number of values, while an ADC output may be a defined number of discrete codes. Thus, an ADC input-output transfer characteristic is an infinite-to-one mapping. In order to determine linearity characteristics for an ADC, a one-to-one mapping may be established between the ADC input and the ADC output by representing the ADC input in terms of transition voltages between ADC output codes, where the transition voltages are discrete. When an ADC has no linearity error, the distance between each adjacent transition level (e.g. ADC code widths) is one least significant bit (LSB). DNL is a measure of a measured distance between adjacent transition levels and a reference distance of one LSB. INL is a measure of a distance between each code transition level and a best fit straight line though the code transition levels.

Figure 1:
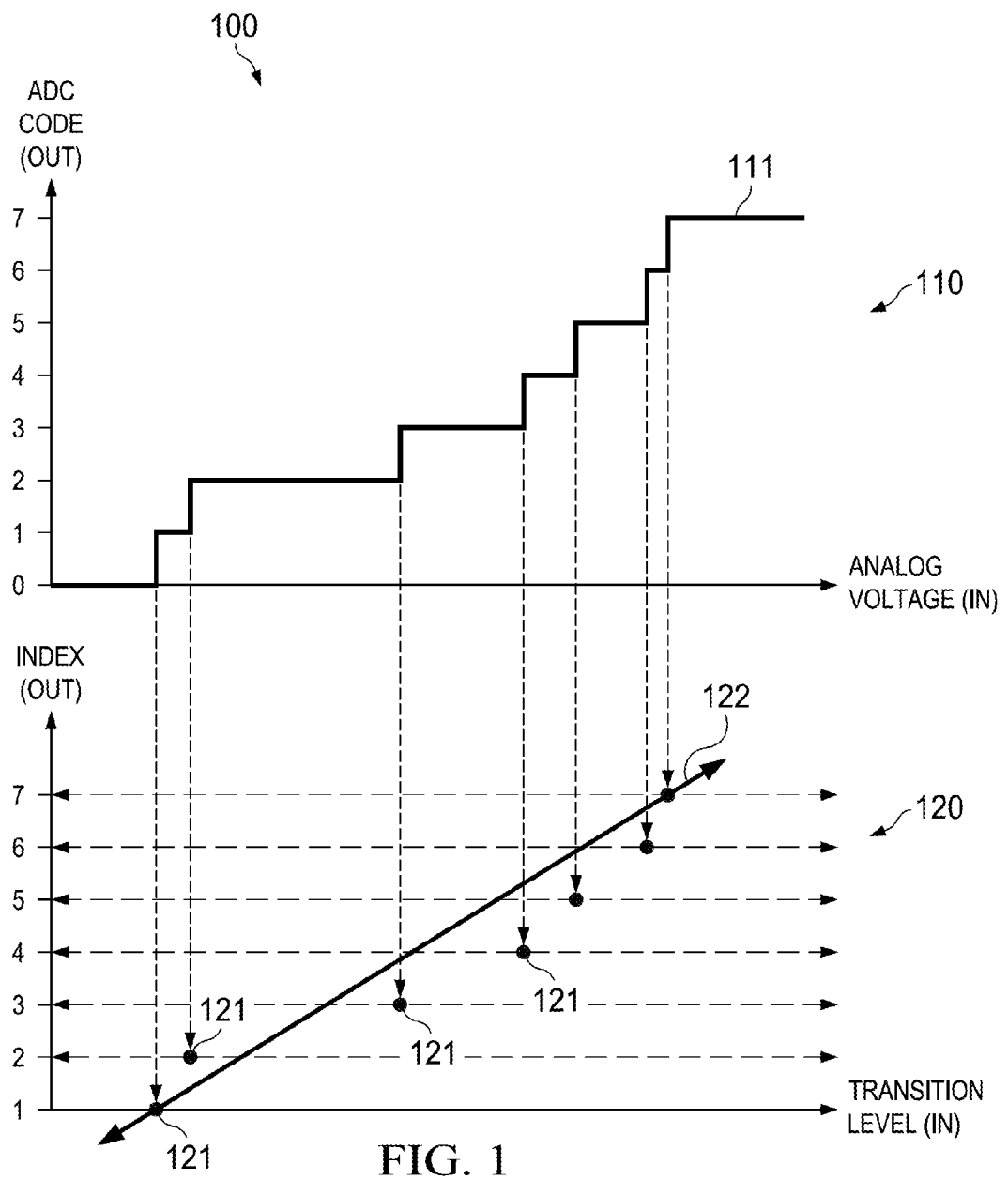
FIG. 1 shows a graph of an ADC transfer function and corresponding ADC DNL measurements by converting ADC input voltage to discrete level transition points in accordance with various embodiments.

FIG. 1 shows a graph 100 of an ADC transfer function and corresponding ADC DNL measurements by converting ADC input voltage to discrete level transition points in accordance with various embodiments. Sub-graph 110 illustrates the ADC transfer function and sub-graph 120 illustrates the ADC DNL measurement. In sub-graph 110, the x-axis may represent input analog voltages in units of Volts and the y-axis may represent ADC discrete output codes. The curve 111 may represent an output transfer function for a 3-bit ADC in response to input voltages. In sub-graph 120, the x-axis may represent voltage transition levels in units of Volts and the y-axis may represent ADC output code indices. In sub-graph 120, each of the data points 121 may correspond to an ADC code transition in sub-graph 110. As can be observed from sub-graphs 110 and 120, the distances between the data points 121 may differ from an ideal value of one LSB, where the differences may represent differential linearity errors (e.g. DNL values). In sub-graph 120, the line 122 drawn between the endpoints of the data points 121 may correspond to a best fit straight line through the data points 121. The distances between each data point 121 and the line 122 may represent integral linearity errors (e.g. INL values).

In an embodiment, an all-code histogram based method may be employed to measure ADC linearity. In the all-code histogram based method, a histogram of ADC output code occurrences may be generated in response to an input signal level which increases linearly within a full scale range of an ADC. A full scale range may refer to a range between a minimum voltage that corresponds to a minimum ADC output code and a maximum voltage that corresponds to a maximum ADC output code. After collecting a sufficiently large amount of samples from an ADC, a histogram of ADC output code occurrences may be generated to provide an accurate measure of DNL. INL may be computed by numerically integrating the DNL values. It should be noted that the number of bins or the size of a histogram may correspond to the number of ADC output codes in an all-code histogram based method. For example, a histogram with 8 bins may be generated for a 3-bit ADC that produces eight ADC output codes, while a histogram with 1024 bins may be generated for a 10-bit ADC that produces 1024 ADC output codes.

Figure 2:
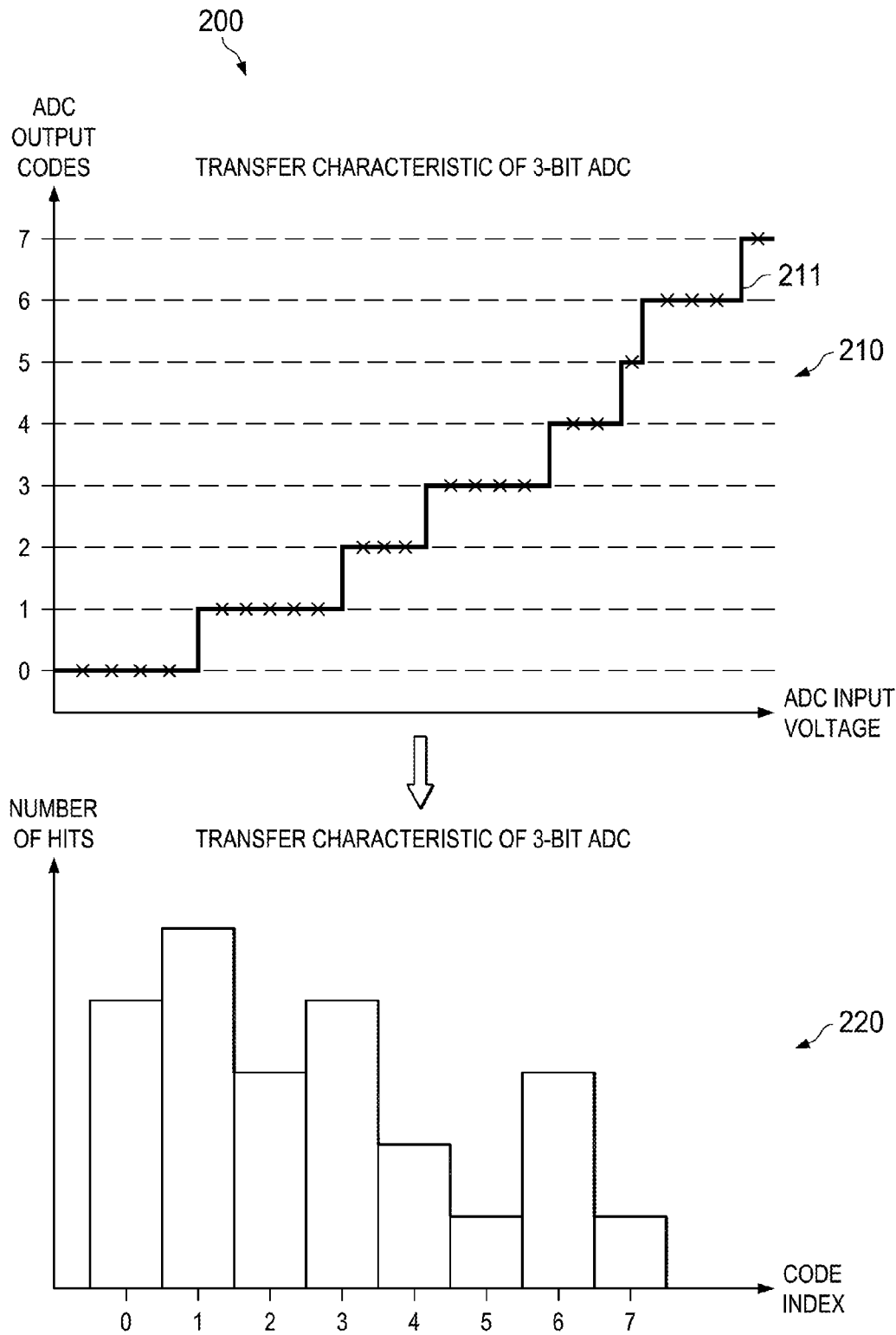
FIG. 2 shows a graph of an ADC transfer function and a corresponding histogram of ADC code occurrences in accordance with various embodiments.

FIG. 2 shows a graph 200 of an ADC transfer function and a corresponding histogram of ADC code occurrences in accordance with various embodiments. The ADC transfer function is illustrated in sub-graph 210 and the corresponding histogram of ADC code occurrences is illustrated in sub-graph 220. In sub-graph 210, the x-axis may represent input analog voltage in units of Volts and the y-axis may represent ADC discrete output code values. In sub-graph 210, the curve 211 may represent an output transfer function for a 3-bit ADC in response to input voltages. In sub-graph 220, the x-axis may represent ADC code index, which may correspond to a histogram bin, and the y-axis may represent the number of ADC code occurrences. As can be observed, the number of code occurrences in each histogram bin is proportional to the distances between each adjacent transition level as shown in curve 211. Thus, a histogram of code occurrences may be employed for measuring ADC DNL and INL.

In some embodiments, a tester employing an all-code histogram based method may apply a ramp voltage (e.g. in linear constant voltage steps) to an ADC and transfer one or more ADC samples from the ADC output after each voltage step adjustment. After sweeping the ADC input voltage to the ADC full scale range, the tester may generate a histogram for the ADC output code occurrences and determine DNL and INL from the histogram. In such embodiments, the tester may employ a significant amount of memory for storage since the size of the histogram may increase in proportion with the number of ADC output codes. In addition, the test time may be significant as a large amount of ADC samples may be transferred to the tester. For example, when testing a 10 mega samples per second (MSPS) 10-bit ADC with an average of about eight occurrences per ADC output code, a tester may transfer about eight thousand (e.g. 1024×8=8096) ADC samples from the ADC via a digital communication interface (e.g. an Inter-Integrated Circuit (I2C) with a transfer rate of 1.5 megahertz (MHz)). The test time per ADC may be about five to about six seconds depending on the ADC sample time and other overhead associated with the digital communication interface. As such, ADC production test time may be significant.

Embodiments of the on-chip ADC linearity test for embedded devices disclosed herein include an ADC BIST scheme employing a moving histogram based method. In an embodiment, ADC DNL and INL may be represented in modified forms to reduce computational complexity and a one-time post processing may be applied to the modified DNL and INL to provide DNL and INL measures that are compliant to the Institute of Electrical and Electronics Engineers (IEEE)

document 1241-2000, which is incorporated herein by reference as if reproduced in its entirety. The lower computational complexity may enable implementation of the DNL and the INL measures on a low cost and/or low performance microcontroller (MCU) and may reduce computational time, and thus production test time. In another embodiment, an ADC linearity test may employ a moving histogram based method with dynamic DNL and INL computations instead of an all-code histogram with post DNL and INL computations. The dynamic computations may enable a BIST to compute a histogram with a small fixed number of bins that is substantially less (e.g. about eight to about thirty two bins) than a number of ADC output codes and slide the histogram across the ADC output code range accordingly as the DNL and the INL are computed for each ADC output code. The lower computational complexity (e.g. modified form) and smaller memory storage (e.g. a fixed size moving histogram) may enable the BIST to be incorporated in an embedded device with an on-chip ADC for linearity test. The BIST may be executed on a low cost and/or low performance MCU (e.g. 8051 MCU) with a small amount (e.g. about 128 bytes) of Random Access Memory (RAM) for histogram computation. The BIST program code may be stored on a small (e.g. about 800 bytes) Read Only Memory (ROM) in the embedded device. In another embodiment, an initialization procedure may be defined to determine an ADC input voltage range suitable for the modified DNL and INL measurements. The disclosed on-chip ADC linearity test may reduce production test time by an order of about five to about six compared to an all-code histogram based method and may provide DNL and INL measurements comparable to the all-code histogram base method.

Figure 3:
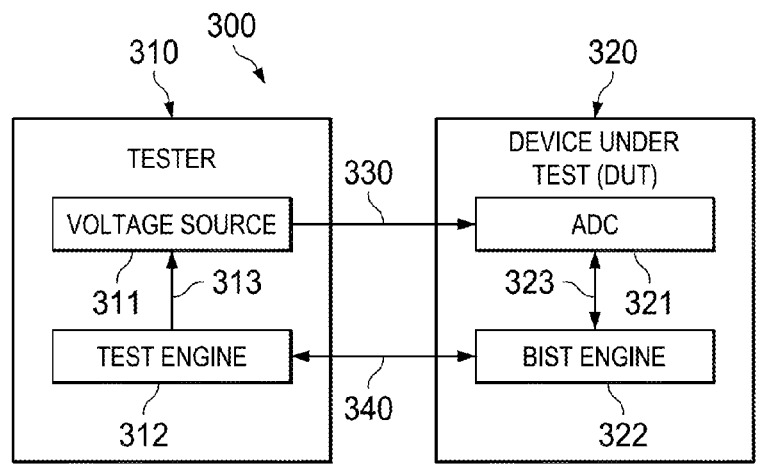
FIG. 3 shows a block diagram of an ADC test set up in accordance with various embodiments.

FIG. 3 shows a block diagram of an ADC test set up 300 in accordance with various embodiments. The ADC test setup 300 may be suitable for testing ADC linearity (e.g. DNL and INL). The ADC test set up 300 may comprise a tester 310 and a device under test (DUT) 320. The tester 310 and the DUT may be connected via an analog connection 330 and a digital connection 340. The analog connection 330 may be any physical link configured to carry analog voltage signals. The digital connection 340 may be any physical link configured to transport digital signals at high speed (e.g. about 1.5 megahertz (MHz) or more). The number of digital signals (e.g. read signal, write signal, command signal, etc.), the format of the digital signals, and the speed of the digital signals may depend on the type of digital communication interface (e.g. Inter-Integrated Circuit (I2C)). In some embodiments, the digital connection 340 may comprise more than one type of digital wired connections, for example, an I2O interface connection and some general purpose digital pin connections.

The tester 310 may comprise an analog voltage source 311 and a test engine 312. The voltage source 311 may be any device configured to generate a high precision (e.g. in millivolt (mV)) linear ramp voltage with a constant step. For example, the voltage source 311 may be a signal generator, a function generation, or any other circuit element suitable for generating a high precision ramp voltage for ADC linearity test. The test engine 312 may be any device configured to control the voltage source 311 via interface 313 (e.g. general purpose interface bus (GPIB), circuits, etc.) and communicate with the DUT 320 via the digital connection 340. For example, the test engine 312 may be a processor, a computer workstation, or any other programmable or non-programmable device configured to execute a test program for performing ADC linearity test. The interface 313 may be a digital interface configured to transport voltage control codes.

The DUT 320 may be any device, such as an embedded device, comprising an on-chip ADC 321 and a BIST engine 322. For example, the DUT 320 may be a DSP, a SoC, etc. The on-chip ADC 321 may be any device configured to convert a continuous analog input signal to a defined number of discrete output codes. For example, the ADC 321 may be a 3-bit ADC with eight output codes, a 10-bit ADC with 1024 output codes, etc. The BIST engine 322 may be any device, such as a general purpose processor or an MCU, configured to control the ADC 321 (e.g. configuration registers) and collect ADC samples (e.g. via one or more output registers, etc.) from the ADC 321 via interface 323 (e.g. digital signals). In addition, the BIST engine 322 may determine DNL and INL for the on-chip ADC 321 by analyzing the collected ADC samples (e.g. generating histograms and computing DNL and INL deviations).

In some embodiments, the test engine 312 may determine ADC linearity test configuration parameters, such as a starting voltage, a stopping voltage, and a voltage step, which may be determined according to the ADC 321 (e.g. ADC full scale voltage range and number of ADC output codes). The voltage step may be a constant step and may be determined such that a sufficient amount of ADC samples may be measured for each ADC output code, for example, about eight or more samples per ADC output code. The test engine 312 may cause the voltage source 311 to be set to a specific voltage and may cause the voltage to be adjusted (e.g. increment by a fixed step) via interface 313. The test engine 312 may send a trigger signal (e.g. a pulse) to the DUT 320 via the digital connection 340 at the end of every voltage adjustment to indicate that the ADC 321 may generate a sample for the adjusted voltage and the BIST engine 322 may process the ADC sample and compute DNL and INL parameters. In addition, the test engine 312 may send test configuration parameters to the DUT 320 at the beginning of an ADC linearity test and may read measured parameters from the DUT 320 at the end of the ADC linearity test via the digital connection 340. It should be noted that the ADC test set up 300 may be alternatively configured to employ a higher performance (e.g. high resolution and linear voltage output) digital-to-analog converter (DAC) in place of the voltage source 311, and thus may be positioned on the same DUT 320 as the ADC 321. In addition, the test engine 312's functionalities may be implemented on the BIST engine 322 instead.

Figure 4:
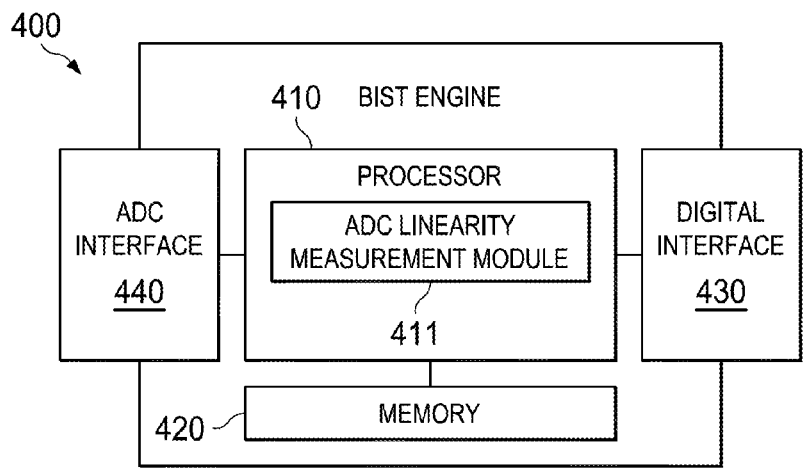
FIG. 4 shows a block diagram of a Built-In Self-Test (BIST) engine in accordance with various embodiments.

FIG. 4 shows a block diagram of a BIST engine 400 in accordance with various embodiments. The BIST engine 400 may be substantially similar to the BIST engine 322 and may be positioned in any embedded device (e.g. DUT 320) comprising an on-chip ADC (e.g. ADC 321). The BIST engine 400 may comprise a processor 410, a memory device 420, a digital interface 430, and an ADC interface 440. The processor 410 may be implemented as a general purpose processor or may be part of one or more processors. The processor 410 may comprise an ADC linearity measurement module 411 stored in internal non-transitory memory in the processor to permit the processor to implement ADC linearity test methods 1100 and/or 1300, described more fully below. In an alternative embodiment, the ADC linearity measurement module 411 may be implemented as instructions stored in the memory device 420, which may be executed by the processor 410. The memory device 420 may comprise a cache for temporarily storing content, for example, a RAM. Additionally, the memory device 420 may comprise a long-term storage for storing content relatively longer, for example, a ROM. For instance, the cache and the long-term storage may include dynamic random access memories (DRAMs), solid-state drives (SSDs), hard disks, or combinations thereof. The digital interface 430 may be any physical link configured to communicate with an ADC tester (e.g. tester 310) and may be substantially similar to digital connection 340. The ADC interface 440 may be any physical link configured to transport ADC samples and/or ADC configurations between an ADC (e.g. ADC 321) and the BIST engine 400.

Figure 5:
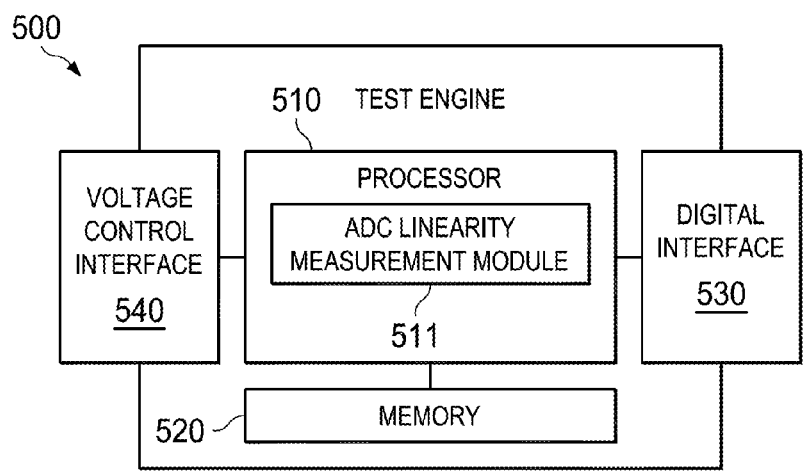
FIG. 5 shows a block diagram of a test engine in accordance with various embodiments.

FIG. 5 shows a block diagram of a test engine 500 in accordance with various embodiments. The test engine 500 may be substantially similar to test engine 312 and may be positioned in any tester (e.g. tester 310). The test engine 500 may comprise a processor 510, a memory device 520, a digital interface 530, and a voltage control interface 540. The processor 510 may be implemented as a general purpose processor or may be part of one or more processors. The processor 510 may comprise an ADC linearity measurement module 511 stored in internal non-transitory memory in the processor to permit the processor to implement ADC linearity test methods 1000 and/or 1200, described more fully below. In an alternative embodiment, the ADC linearity measurement module 511 may be implemented as instructions stored in the memory device 520, which may be executed by the processor 510. The memory device 520 may be substantially similar to the memory device 420. The digital interface 530 may be any physical link configured to communicate with a DUT (e.g. DUT 320) and may be substantially similar to digital connection 340. The voltage control interface 440 may be any physical link (e.g. general purpose interface bus (GPIB), circuits, etc.) configured to send controls to a variable voltage source instrument (e.g. signal generator, functional generator).

In an embodiment, an N-bit ADC may produce $2^N$ ADC output codes ranging from $C_{lo}$ (e.g. a value zero) to $C_{hi}$ (e.g. a value of $2^N-1$). A histogram of ADC output code occurrences may be generated between code $C_{lo+1}$ and code $C_{hi-1}$ for DNL and INL measurements. The minimum code $C_{lo}$ and the maximum code $C_{hi}$ may be excluded from the histogram since any ADC underflow may be converted to the minimum code $C_{lo}$ any ADC overflow may be converted to the maximum code $C_{hi}$. Thus, the total number of ADC code occurrences excluding the lowest and highest bins may be represented as:

$$h_{sum} = \Sum_{i=C_{lo+1}}^{C_{hi-1}} h(i) \quad \text{Equation (1)}$$

where $h_{sum}$ is the total number of code occurrences and h(i) is the number of occurrences for the $i^{th}$ ADC output code (e.g. $C_i$).

The average number of code occurrences for each bin may be computed as:

$$h_{avg} = \frac{h_{sum}}{dlt} \quad \text{Equation (2)}$$

where $h_{avg}$ is the average number of code occurrences and dlt is the number of bins in the histogram excluding the lowest and highest bins and may be represented as:

$$dlt = C_{hi} - C_{lo} - 1 \quad \text{Equation (3)}$$

As described herein above, the number of code stored in internal non-transitory memory in the processor to permit the processor to occurrences may be proportional to the distances between adjacent transition levels. Thus, the average number of code occurrences $h_{avg}$ may correspond to an ideal value of one LSB and the measured number of code occurrences for an $i^{th}$ ADC code h(i) may correspond to the measured distance between adjacent transition levels. A normalized code width cw(i) for an ADC may be represented as shown below:

$$cw(i) = \frac{h(i)}{h_{avg}}, i = C_{lo+1}, C_{lo+2}, \ldots, C_{hi-1} \quad \text{Equation (4)}$$

As described herein above, DNL is a measure of a measured distance between adjacent transition levels and an ideal value of one LSB. Thus, a DNL value for an ADC output code may be computed as shown below:

$$DNL(i) = cw(i) - 1, i = C_{lo+1}, C_{lo+2}, \ldots, C_{hi-1} \quad \text{Equation (5)}$$

where DNL(i) is a DNL value for the $i^{th}$ ADC output code $C_i$. It should be noted that a DNL value as shown in Equation (5) may not have a value less than minus one and a value of minus one may indicate a missing ADC code (e.g. zero occurrences).

As described herein above, INL is a measure of a distance between each code transition level and a best fit straight line though the code transition levels. Thus, INL may be computed by accumulating DNL values at each ADC code transition as shown below:

$$INL(i) = \Sum_{k=1}^{i} dnl(k), i = C_{lo+1}, C_{lo+2}, \ldots, C_{hi-1} \quad \text{Equation (6)}$$

In an embodiment, an ADC performance specification may include DNL parameters and INL parameters. For example, DNL parameters may include a minimum DNL value and a maximum DNL value for an ADC and INL parameters may include a minimum INL value and a maximum INL value for the ADC. Thus, an ADC linearity test may dynamically compute and update the DNL parameters and the INL parameters without storing a histogram for all code occurrences. For example, an ADC linearity test may compute a number of code occurrences for an ADC as ADC samples are read (e.g. at every voltage increment). When the ADC input voltage passes a level sufficiently far from an ADC output code $C_i$ such that the ADC may not produce another output code $C_i$, the ADC linearity test may compute a DNL value and an INL value for the ADC output code $C_i$ and dynamically update the minimum DNL value, the maximum DNL value, the minimum INL value, and the maximum INL value.

Recall that a DNL value for an ADC output code may be computed in terms of code width (e.g. cw(i) in Equation (5)), where the code width is proportional to the number of code occurrences (e.g. h(i) in Equation (4)). Thus, an ADC linearity test may compute a maximum code occurrences and a minimum code occurrences instead of a maximum DNL value and a minimum DNL value during a voltage sweep. At the end of the voltage sweep, the ADC linearity test may compute the maximum DNL value and the minimum DNL value from the maximum code occurrences and the minimum code occurrences, respectively, by substituting Equations (2), (3), and (4) into Equation (5). Thus, the maximum DNL value and the minimum DNL value may be computed as shown below:

$$DNL = \frac{h(i)}{h_{sum}} \times dlt - 1 \quad \text{Equation (7)}$$

where h(i) may be the maximum code occurrences when computing the maximum DNL value and h(i) may be the minimum code occurrences when computing the minimum DNL value.

Recall that an INL value for an ADC code is a cumulative sum of DNL values. However, the INL value may not be simplified by accumulating the code occurrences in place of DNL values. Since the INL value is a cumulative sum of DNL values, the mean DNL value over a code span dlt may be close to zero for the INL value to be meaningful. A non-zero DNL offset across the code span dlt may be integrated during the INL calculation causing a ramping error in the INL values. As can be observed in Equation (4), each DNL value may be normalized to an average number of code occurrences $h_{avg}$ (e.g. code width of one LSB) such that the mean DNL value may be close to zero over the span dlt.

In an embodiment, an INL value may be represented in a modified form to reduce computational complexity. As can be observed in Equation (7), a DNL value is computed with a division operation, which may be expensive in terms of clock cycles and/or memory storage for a low cost MCU (e.g. MCU 8051). However, Equation (7) may be modified to remove the division operation by cross multiplying Equation (7) with the term $h_{sum}$ as shown below:

$$DNL_{hsum} = h_{sum} \times DNL = h(i) \times dlt - h_{sum} \qquad \text{Equation (8)}$$

A modified INL value may be computed as shown below:

$$INL_{hsum} = INL_{hsum} + DNL_{hsum} \qquad \text{Equation (9)}$$

As such, an ADC linearity test may compute the modified INL values and dynamically update a maximum modified INL value and a minimum modified INL value. At the end of the ADC linearity test, the maximum INL value and the minimum INL value may be computed by dividing the maximum modified INL value and the minimum modified INL values with $h_{sum}$, respectively, where the computed maximum and minimum INL values are compliant to the IEEE document 1241-2000. It should be noted that an all-code histogram based method may compute a total number of code occurrences after generating the all-code histogram, whereas an ADC linearity test that computes INL values dynamically may include a calibration procedure for estimating a total number of code occurrences $h_{sum}$ prior to taking ADC sample measurements.

In an embodiment, an ADC linearity test may measure DNL and INL for an ADC by computing a histogram for a small range (e.g. less than about thirty two) of ADC codes and moving the histogram across an ADC code span (e.g. dlt). As such, the histogram may be computed with a small number of bins and the number of bins may not increase in proportion with the number of ADC output codes. An ADC linearity test employing a moving histogram may be referred to as a moving histogram based method. The following tables describe some parameters that may be employed in a moving histogram based method:

TABLE 1

ADC linearity Test Parameters

| Parameters | Description |
|---|---|
| $C_{lo}$, $C_{hi}$ | Minimum and maximum ADC output code (e.g. $C_{lo} = 0$ and $C_{hi} = 1023$ for a 10-bit ADC) |
| $N_{bin}$ | Number of bins in a moving histogram |
| $h[N_{bin}]$ | Array with $N_{bin}$ elements for storing a moving histogram |
| dlt | Span of ADC codes over which the linearity is measured, where dlt = $C_{hi} - C_{lo} - 1$ |
| $V_{step}$ | Size of voltage input $V_{in}$ increment (in Volts) |
| $V_{ADCmin}$ | Minimum ADC input voltage (in Volts) |
| $V_{ADCmax}$ | Maximum ADC input voltage (in Volts) |
| $V_{Idxlo}$ | Number of voltage increments at code transition from $C_{lo}$ to $C_{lo+1}$ |
| $V_{Idxhi}$ | Number of voltage increments at code transition from $C_{hi-1}$ to $C_{hi}$ |
| $V_{TestStart}$ | Minimum voltage for linearity test (in Volts) |
| $V_{TestStop}$ | Maximum voltage for linearity test (in Volts) |

TABLE 1-continued

ADC linearity Test Parameters

| Parameters | Description |
|---|---|
| $h_{sum}$ | Total number of ADC samples in histogram bins $C_{lo+1}$ to $C_{hi-1}$ inclusive. |
| $ADC_{val}$ | The value of the most current ADC sample |
| $INL_{val}$ | The value of the most current INL value |
| $C_{h0}$ | ADC code represented by h[0] |
| $h_{max}$ | Maximum number of occurrences in any one ADC code bin over ADC code range $C_{lo+1}$ to $C_{hi-1}$ |
| $h_{min}$ | Minimum number of occurrences in any one ADC code bin over ADC code range $C_{lo+1}$ to $C_{hi-1}$ |
| $C_{hmax}$ | ADC code corresponding to $h_{max}$ |
| $C_{hmin}$ | ADC code corresponding to $h_{min}$ |
| $INL_{ScaledMax}$ | Maximum INL value scaled with $h_{sum}$ in any one ADC code bin over ADC code range $C_{lo+1}$ to $C_{hi-1}$ |
| $INL_{ScaledMin}$ | Minimum INL value scaled with $h_{sum}$ in any one ADC code bin over ADC code range $C_{lo+1}$ to $C_{hi-1}$ |
| $C_{INLmax}$ | ADC code corresponding to $INL_{ScaledMax}$ |
| $C_{INLmin}$ | ADC code corresponding to $INL_{ScaledMin}$ |

Figure 6:
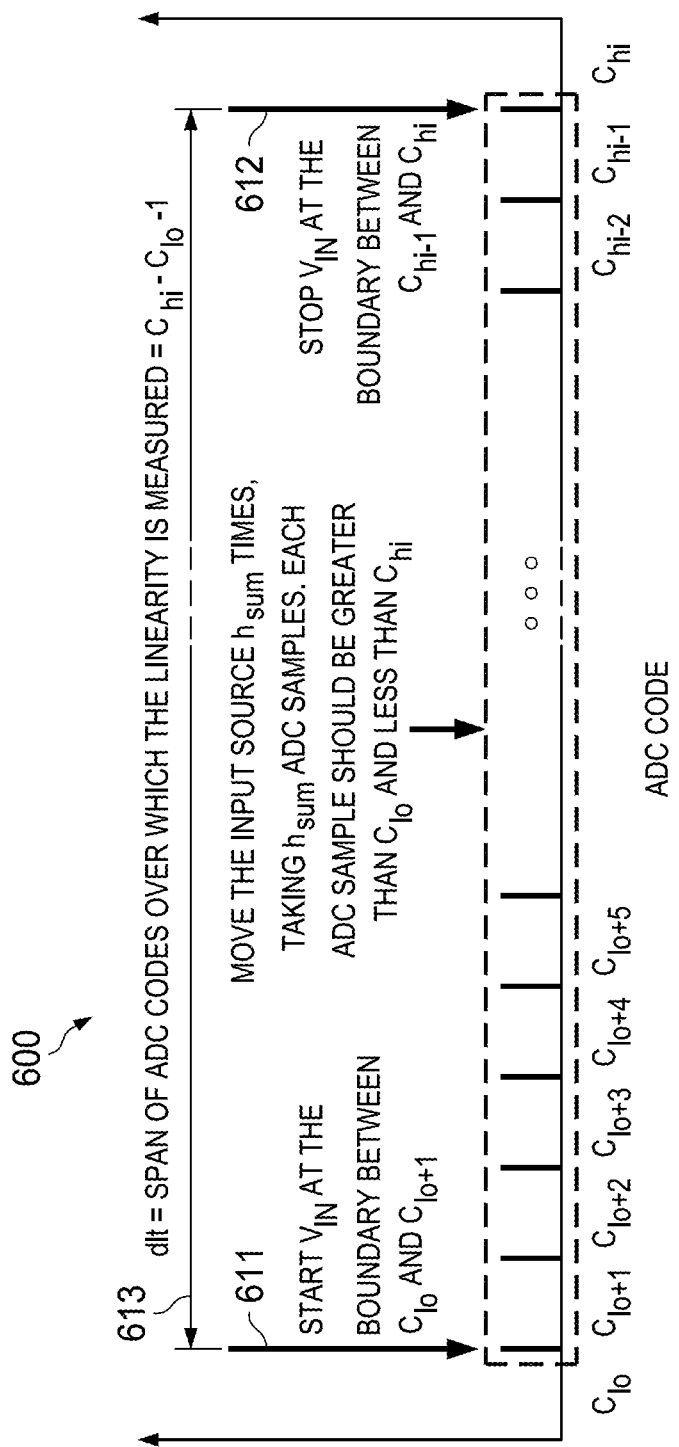
FIG. 6 shows a graph of an ADC linearity test code range in accordance with various embodiments.

FIG. 6 shows a graph 600 of an ADC code range for ADC linearity test in accordance with various embodiments. In graph 600, the x-axis may represent ADC output codes, where the ADC output codes may vary from a minimum ADC code $C_{lo}$ to a maximum ADC code $C_{hi}$. A moving histogram based method may exclude the two endpoints $C_{lo}$ and $C_{hi}$ since any ADC underflow, overflow, and/or noise may cause the ADC to produce the minimum code $C_{lo}$ or the maximum code $C_{hi}$, and thus may distort DNL and INL measurements. As such, a moving histogram based method may begin with setting an ADC input voltage $V_{in}$ at a voltage (e.g. a starting voltage) that corresponds to a code transition 611 at a boundary between $C_{lo}$ and $C_{lo+1}$ and incrementing the ADC input voltage $V_{in}$ in steps of $V_{step}$ until the ADC input voltage $V_{in}$ reaches a voltage (e.g. a stopping voltage) that corresponds to a code transition 612 at a boundary between $C_{hi-1}$ and $C_{hi}$.

The voltage step $V_{step}$ may be determined such that a sufficient amount of ADC samples (e.g. about eight samples) may be collected for each ADC code over a voltage range for the ADC code, for example, a voltage range for an ADC output code may be divided into eight equal voltage steps and one ADC sample may be read for each voltage step. As such, a total number of ADC code occurrences $h_{sum}$ may correspond to the total number of voltage steps between the starting voltage and the stopping voltage over a code span dlt 613 (e.g. dlt=$C_{hi}$-$C_{lo}$-1). However, ADC devices may vary due to process variation, thus the starting voltage and the stopping voltage may vary from one device to another device. As such, when applying a moving histogram based method, each ADC device may be calibrated to determine a starting voltage and a stopping voltage prior to linearity measurements such that $h_{sum}$ may be determined accurately. It should be noted that an inaccurate estimate of $h_{sum}$ may affect INL calculation significantly (e.g. cumulative along ADC codes), which may be discussed more fully below.

Figure 7:
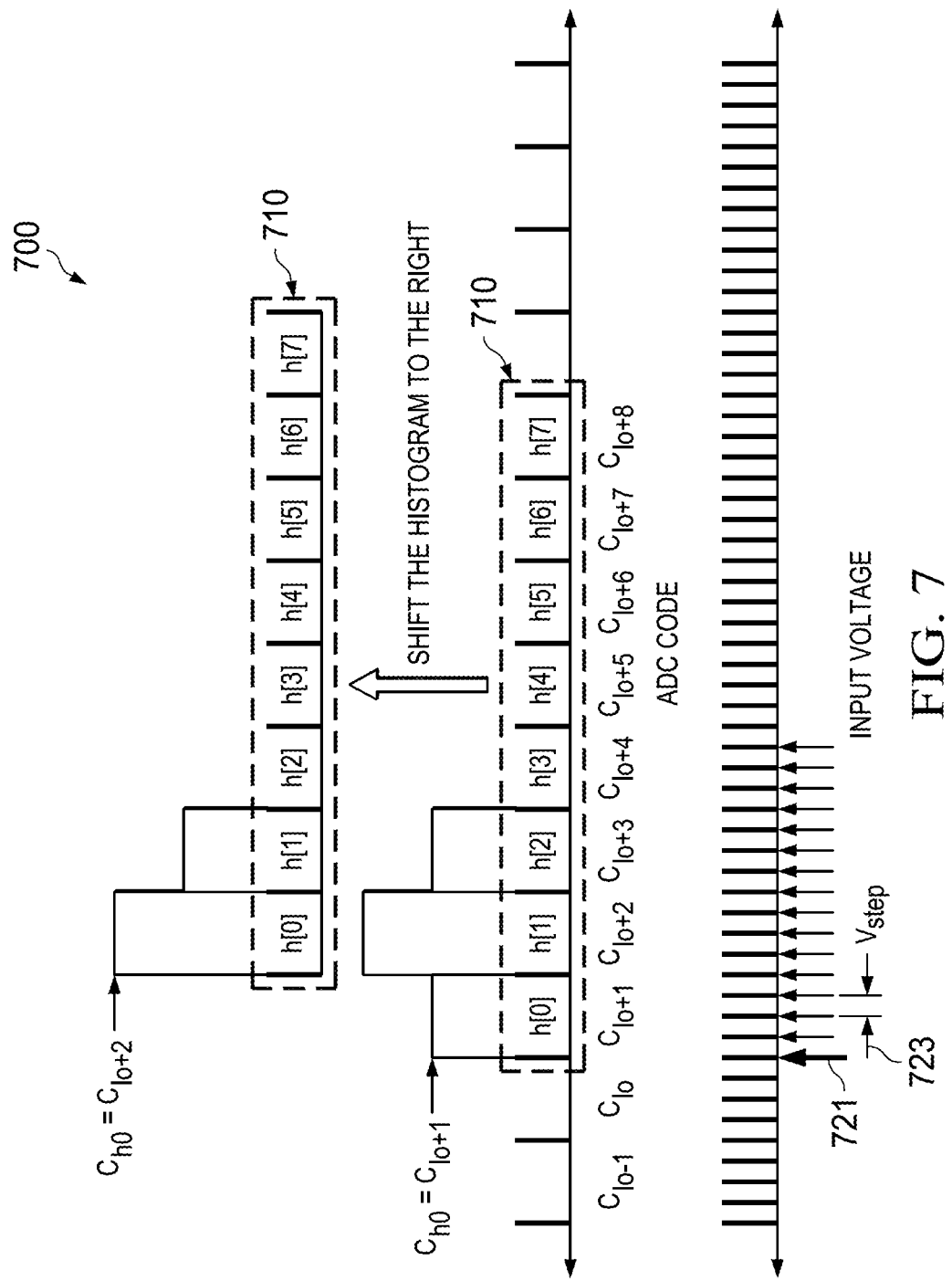
FIG. 7 shows a graphical representation of a moving histogram based method in accordance with various embodiments.

FIG. 7 shows a graphical representation of a moving histogram based method 700 in accordance with various embodiments. The moving histogram based method 700 may be implemented on a BIST engine (e.g. BIST engine 322 or 400). The steps in a moving histogram based method may be broadly divided into three high level steps, a histogram computation step, a linearity error computation step, and a histogram shifting step. In method 700, a histogram 710 (e.g. $h[N_{bin}]$) with eight bins (e.g. $N_{bin}$=8) may be employed for counting a number of code occurrences. Method 700 may begin when an ADC input voltage (e.g. voltage source 311)

$V_{in}$ is at a voltage 721 (e.g. starting voltage) that corresponds to a code transition at a boundary between $C_{lo}$ and $C_{lo+1}$. Method 700 may generate a histogram 710 with a lowest bin (e.g. h[0]) corresponding to code $C_{lo+1}$ and the highest bin (e.g. h[7]) corresponding to code $C_{lo+8}$. During histogram computation, method 700 may read an ADC sample after each voltage step $V_{step}$ 723 increment (e.g $V_{in}=V_{in}+V_{step}$) and compute the histogram accordingly, for example, accumulating a number of occurrences for a bin that corresponds to a value of the ADC sample.

When the ADC input voltage $V_{in}$ reaches a voltage that corresponds to an ADC code (e.g. $C_{lo+4}$ to $C_{lo+5}$) at about a middle of the histogram 710, method 700 may perform linearity error computation. During linearity error computation, method 700 may compute an INL value for an ADC code (e.g. $C_{h0}$) that corresponds to the lowest bin according to Equation (9). In addition, method 700 may compare the number of code occurrences h[0] for the lowest bin to a maximum code occurrences $h_{max}$ and a minimum code occurrences $h_{min}$. For example, $h_{min}$ may be updated to h[0] when h[0] is less than $h_{min}$. Similarly, $h_{max}$ may be updated to h[0] when h[0] is greater than $h_{max}$. It should be noted that the maximum code occurrences $h_{max}$ may be initialized to a value of zero and the minimum code occurrences $h_{min}$ may be initialized to a large value (e.g. larger than total number of code occurrences) at the beginning of the test.

After computing linearity error for the ADC output code corresponding to the lowest bin in the histogram, method 700 may shift the histogram 710 by one ADC code, for example, after shifting the histogram 710, the lowest bin h[0] may corresponds to code $C_{lo+2}$ and the highest bin h[7] may corresponds to code $C_{lo+9}$.

Figure 8:
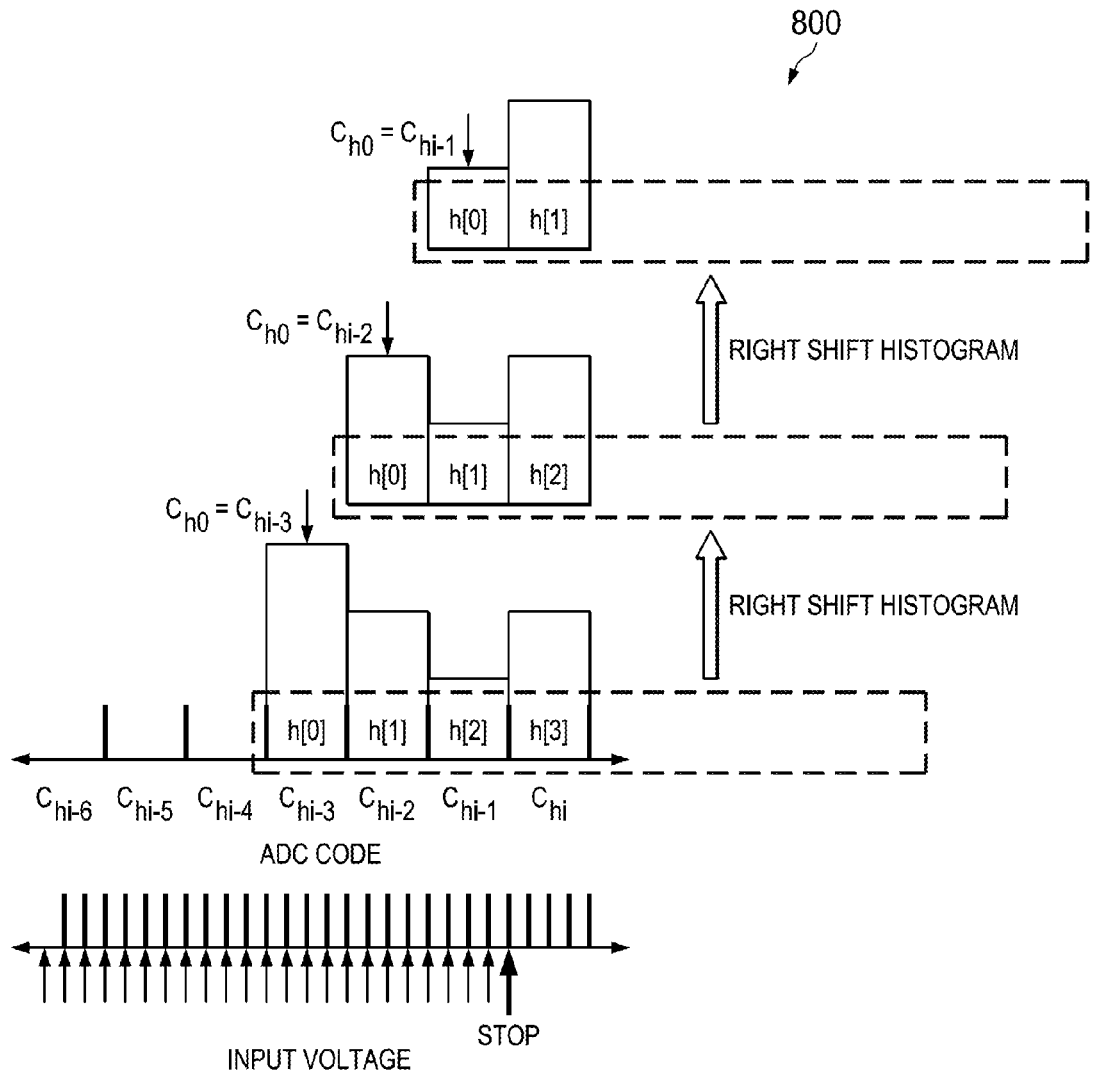
FIG. 8 shows a graphical representation of another moving histogram based method in accordance with various embodiments.

Subsequently, method 700 may continue to perform histogram computation and repeat the linearity error computation and the histogram shifting at each code transition (e.g. after receiving about $h_{avg}$ ADC samples) until the ADC input voltage reaches a voltage corresponding to a code transition from $C_{hi-1}$ to $C_{hi}$. Since the linearity error computation and the histogram shifting may lag the histogram computation, method 700 may continue to perform linearity error computation and the histogram shifting for the remaining ADC output codes until the lowest bin (e.g. h[0]) of the histogram 710 corresponds to the ADC code $C_{hi-1}$ as shown in FIG. 8.

Figure 9:
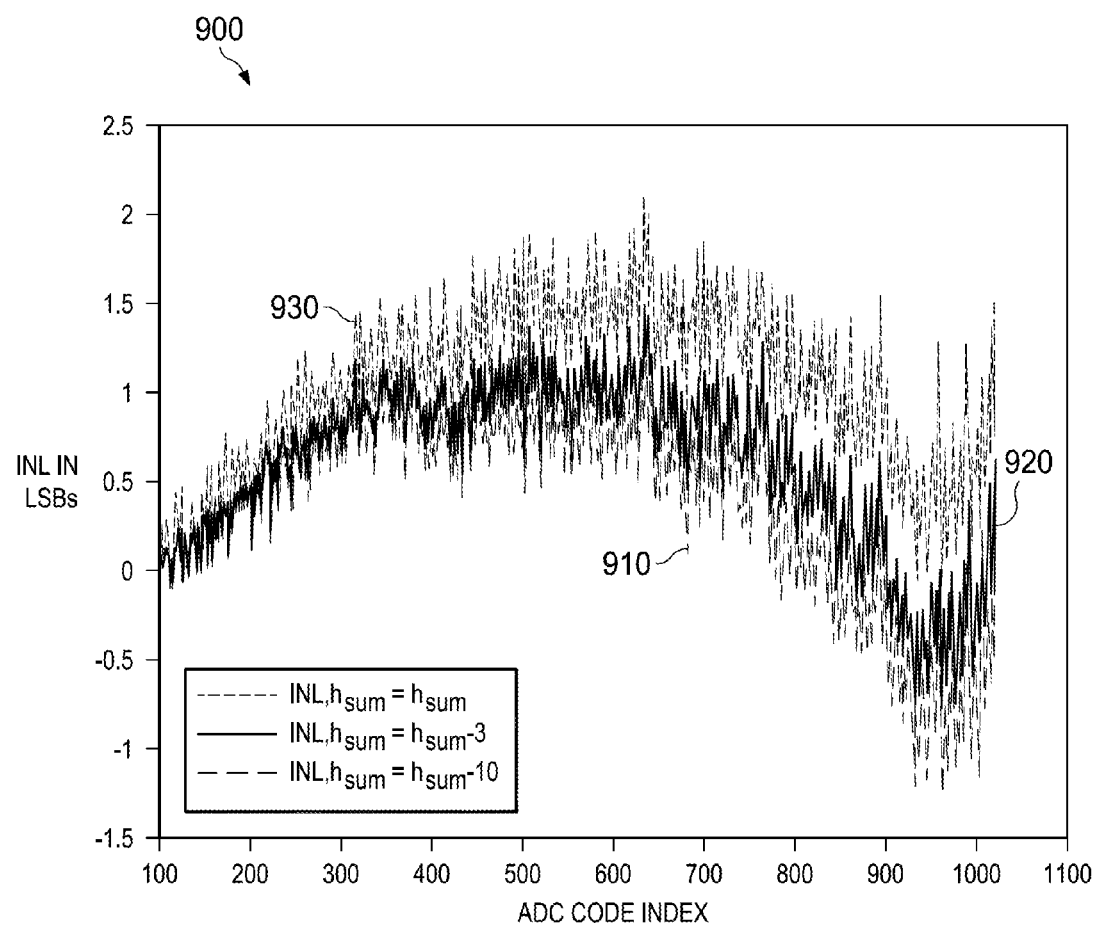
FIG. 9 shows a graph of ADC INL measurements in accordance with various embodiments.

FIG. 9 shows a graph 900 of ADC INL measurements in accordance with various embodiments. The x-axis may represent ADC code index. The y-axis may represent INL values in LSBs. The curves 910, 920, and 930 may represent INL values in units of LSBs across ADC codes for a 10-bit ADC on an embedded device. The INL values are measured by employing a moving histogram based method, such as method 700. The INL values are computed according to Equation (9) and then divided by $h_{sum}$. The curve 910 may represent INL values when $h_{sum}$ is the total number of code occurrences computed over a code span dlt in which INL values are computed. The curve 920 may represent INL values when $h_{sum}$ computation has an error of minus three and the curve 930 may represent INL values when $h_{sum}$ computation has an error of minus ten. As can be observed from curves 910, 920, and 930, the INL measurement errors due to inaccurate $h_{sum}$ are significant and may increase as the ADC code increases. As such, INL values measured from a moving histogram based method may depend highly on the accuracies of $h_{sum}$. It should be noted that noise may also causes $h_{sum}$ to be incorrect. For example, $h_{sum}$ may be computed according to a starting voltage and a stopping voltage for a code span dlt prior to measuring INL. However, some ADC output codes (e.g. outliers) may fall outside of the code range dlt due to noise and may not be counted towards the code occurrences. Thus, if an outlier is detected when the ADC input voltage is close to the starting voltage or the stopping voltage, $h_{sum}$ may be adjusted accordingly.

Figure 10:
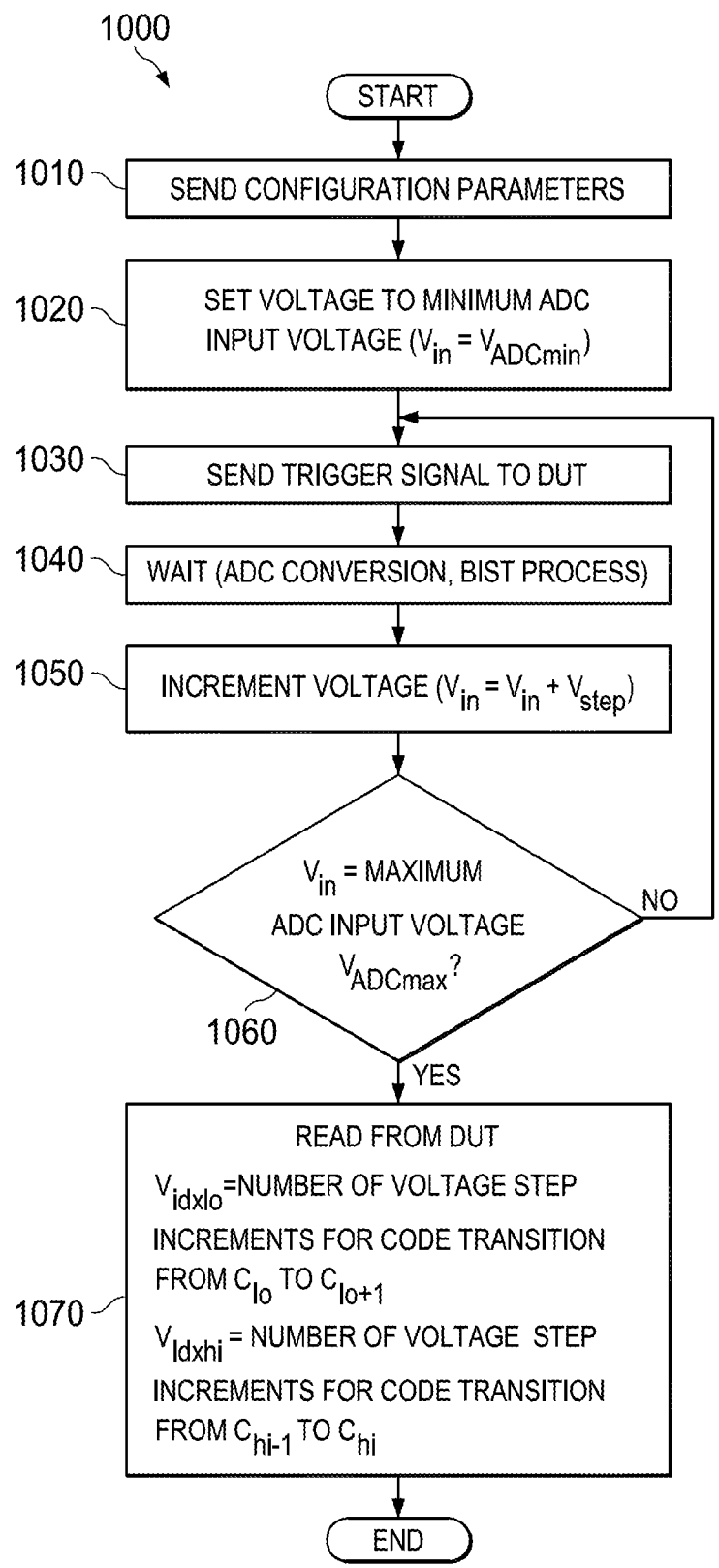
FIG. 10 shows a flowchart of an ADC linearity test calibration method in accordance with various embodiments.

FIG. 10 shows a flowchart of an ADC linearity test calibration method 1000 in accordance with various embodiments. Method 1000 may be implemented on a tester (e.g. tester 310) in a test set up substantially similar to ADC test set up 300. Method 1000 may be employed for determining a starting voltage $V_{TestStart}$ and a stopping voltage $V_{TestStop}$ where $V_{TestStart}$ may correspond to a voltage that causes a code transition from $C_{lo}$ to $C_{lo+1}$ and $V_{TestStop}$ may correspond to a voltage that causes a code transition from $C_{hi-1}$ to $C_{hi}$. Method 1000 may begin with sending test configuration parameters to a DUT (e.g. DUT 320) at step 1010. The test configuration parameters may include the two transition codes $C_{lo+1}$ and $C_{hi}$.

At step 1020, method 1000 may set an ADC input voltage $V_{in}$ of a voltage source (e.g. voltage source 311) to a minimum ADC input voltage $V_{ADCmin}$. At step 1030, method 1000 may send a trigger signal to the DUT. After sending the trigger signal, method 1000 may wait for a period of time at step 1040. During this time period, the DUT may perform an ADC conversion and compute ADC measurements. When the time period is expired, method 1000 may proceed to step 1050. At step 1050, method 1000 may increase the ADC input voltage $V_{in}$ by one voltage step $V_{step}$ (e.g. $V_{in}=V_{in}$ $V_{step}$). At step 1060, method 1000 may determine whether the ADC input voltage $V_{in}$ is at a maximum ADC input voltage $V_{ADCmax}$. If the ADC input voltage is not at the maximum ADC input voltage $V_{ADCmax}$, method 1000 may proceed to step 1030. Method 1000 may repeat the loop of steps 1030 to 1060 until the ADC input voltage $V_{in}$ reaches the maximum ADC input voltage $V_{ADCmax}$.

At step 1070, method 1000 may read data from the DUT. The data may include a starting voltage index $V_{Idxlo}$ and a stopping voltage index $V_{Idxhi}$, where the starting voltage index $V_{Idxlo}$ may indicate the number of voltage increments at which a code transition from $C_{lo}$ to $C_{lo+1}$ is detected and the stopping voltage index $V_{Idxhi}$ may indicate the number of voltage increments at which a code transition from $C_{hi-1}$ to $C_{hi}$ is detected. It should be noted that method 1000 may compute the starting voltage $V_{TestStart}$ and the stopping voltage $V_{TestStop}$ according to the start voltage index $V_{Idxlo}$ (e.g. $V_{TestStart}=V_{ADCmin}+V_{step}\times V_{Idxlo}$) and the stopping voltage index $V_{Idxhi}$ (e.g. $V_{TestStop}=V_{ADCmin}$ $V_{step}\times V_{Idxhi}$), respectively. It should be noted that method 1000 may employ some alternative voltage to index or code mappings, which may depend on the tester and/or the voltage source configurations.

Figure 11:
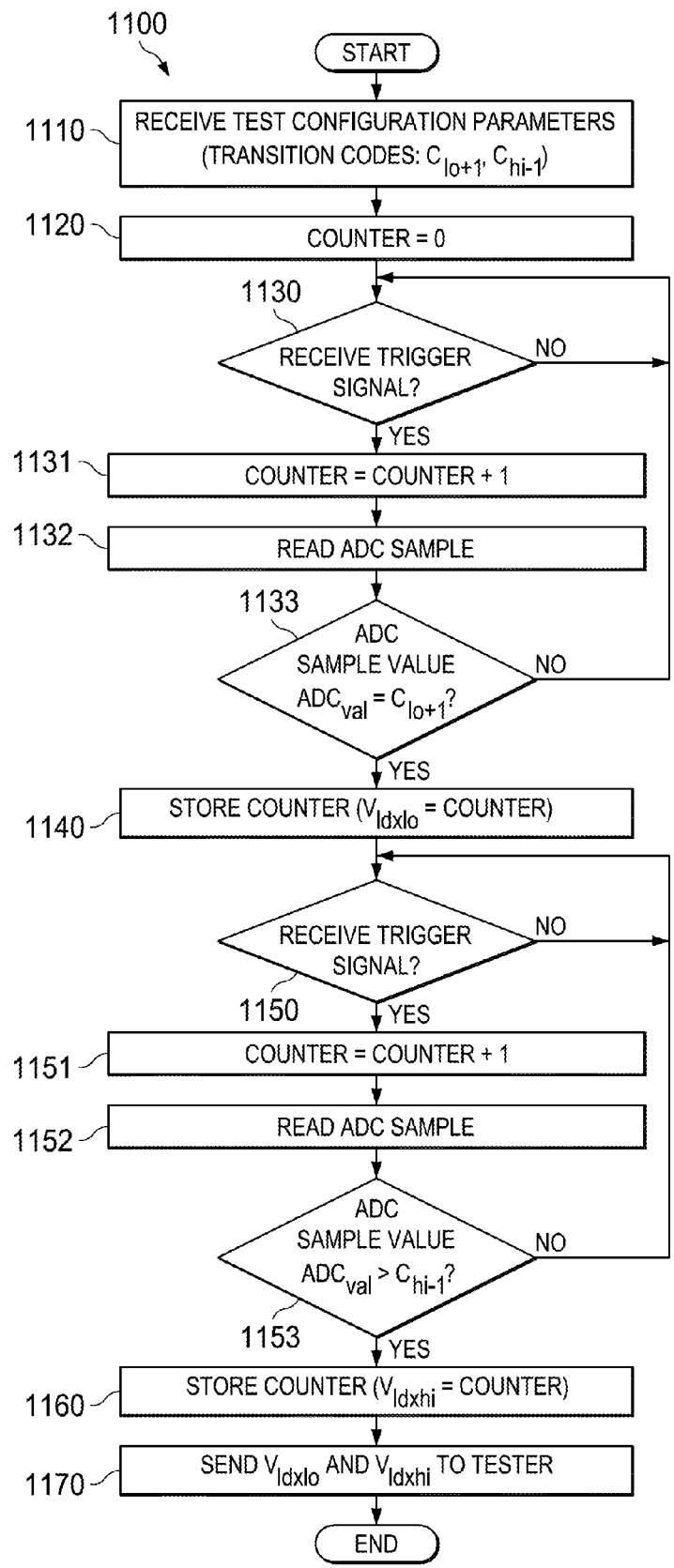
FIG. 11 shows a flowchart of another ADC linearity test calibration method in accordance with various embodiments.

FIG. 11 shows a flowchart of another ADC linearity test calibration method 1100 in accordance with various embodiments. Method 1100 may be implemented on a BIST engine (e.g. BIST engine 322 and 400) in a test set up substantially similar to ADC test set up 300. Method 1100 may be employed for determining a starting voltage $V_{TestStart}$ and a stopping voltage $V_{TestStop}$, where $V_{TestStart}$ may correspond to a voltage that causes a code transition from $C_{lo}$ to $C_{lo+1}$ and $V_{TestStop}$ may correspond to a voltage that causes a code transition from $C_{hi-1}$ to $C_{hi}$. Method 1100 may begin with receiving initialization parameters from a tester (e.g. tester 310) at step 1110. Initialization parameters may include a first ADC output code (e.g. $C_{lo+1}$) and a second ADC output code (e.g. $C_{hi-1}$) for linearity measurements. At step 1120, method 1100 may initialize a counter to zero.

At step 1130, method 1100 may wait for a trigger signal from the tester. When the trigger signal is received, method 1100 may proceed to step 1131. At step 1131, method 1100 may increment the counter. At step 1132, method 1100 may read an ADC sample. At step 1133, method 1100 may determine whether the value of the ADC sample $ADC_{val}$ equals to the first ADC output code $C_{lo+1}$. If the ADC sample value $ADC_{val}$ does not exceed the first ADC output code $C_{lo+1}$, method 1100 may return to step 1130 and repeat the loop of steps 1130 to 1133. If the ADC sample value $ADC_{val}$ exceeds the first ADC output code $C_{lo+1}$, method 1100 may proceed to step 1140. At step 1140, method 1100 may store the counter value to a starting voltage index $V_{Idxlo}$.

At step 1150, method 1100 may wait for a trigger signal from the tester. When the trigger signal is received from the tester, method 1100 may proceed to step 1151. At step 1151, method 1100 may increment the counter. At step 1152, method 1100 may read an ADC sample. At step 1153, method 1100 may determine whether the ADC sample value $ADC_{val}$ exceeds the second ADC output code $C_{hi-1}$. If the ADC sample value $ADC_{val}$ does not exceed the second ADC output code $C_{hi-1}$, method 1100 may return to step 1150 and repeat the loop of steps 1150 to 1153. If the ADC output sample value $ADC_{val}$ exceeds the second ADC output code $C_{hi-1}$, method 1100 may proceed to step 1160. At step 1160, method 1100 may store the counter value to a stopping voltage index $V_{Idxhi}$. At step 1170, method 1100 may send the starting voltage index $V_{Idxlo}$ and the stopping voltage index $V_{Idxhi}$ to the tester. It should be noted that an ADC linearity test may read one ADC sample per voltage increment, thus the difference between $V_{Idxlo}$ and $V_{Idxhi}$ may correspond to a total number of code occurrences $h_{sum}$ in the ADC linearity test.

Figure 12:
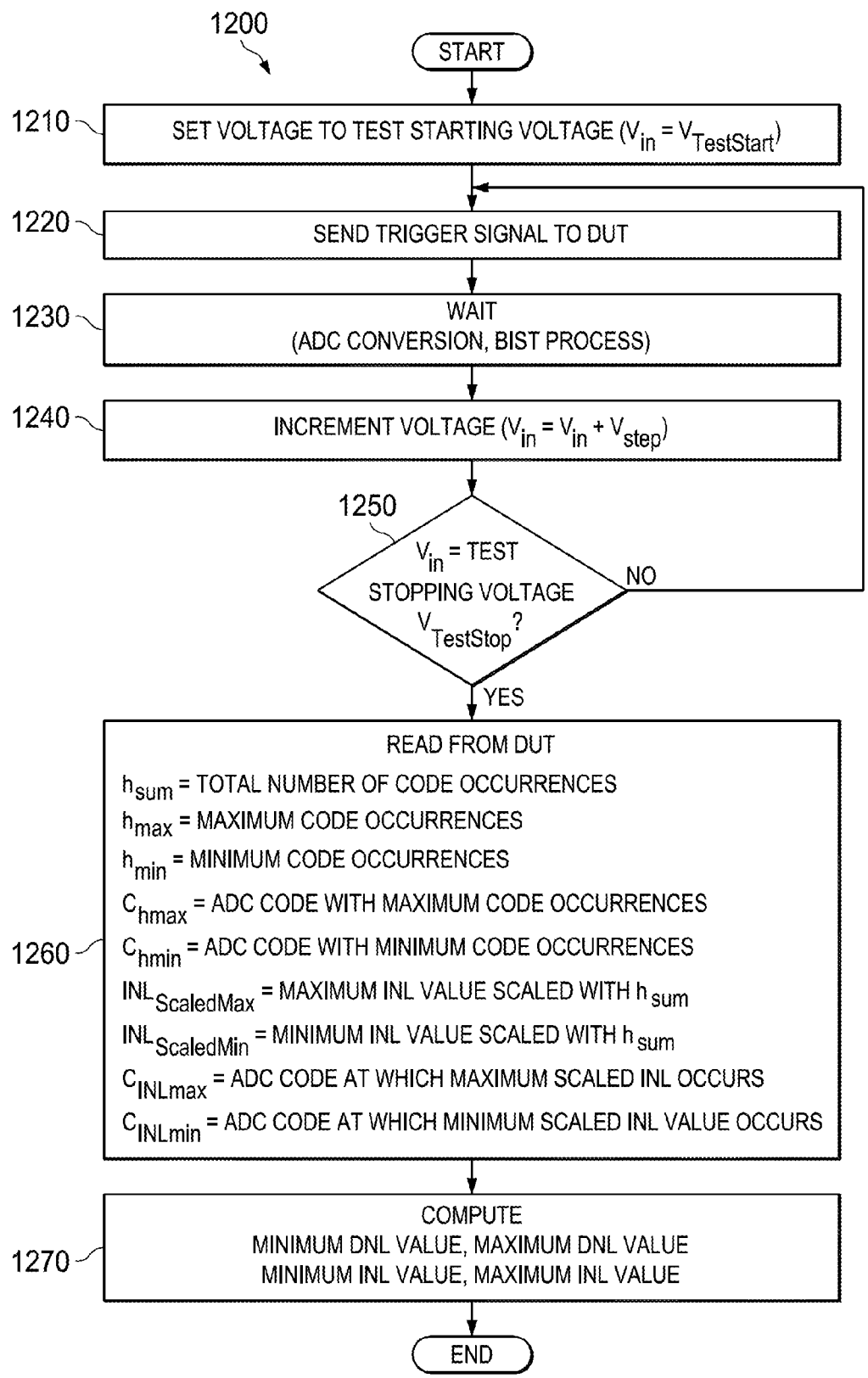
FIG. 12 shows a flowchart of an ADC linearity test method in accordance with various embodiments.

FIG. 12 shows a flowchart of an ADC linearity test method 1200 in accordance with various embodiments. Method 1200 may be implemented on a tester (e.g. tester 310) in a test set up substantially similar to ADC test set up 300. Method 1200 may be employed for measuring linearity parameters for an ADC (e.g. ADC 321) on a DUT (e.g. DUT 320). Method 1200 may begin after the ADC is calibrated for a starting voltage $V_{TestStart}$ and a stopping voltage $V_{TestStop}$, for example, by employing method 1000. The starting voltage $V_{TestStart}$ may correspond to a voltage that causes a code transition from $C_{lo}$ to $C_{lo+1}$ and the stopping voltage $V_{TestStop}$ may correspond to a voltage that causes a code transition from $C_{hi-1}$ to $C_{hi}$.

At step 1210, method 1200 may set an ADC input voltage $V_{in}$ of a voltage source (e.g. voltage source 311) to the starting voltage $V_{TestStart}$. At step 1220, method 1200 may send a trigger signal to the DUT. After sending the trigger signal, method 1200 may wait for a period of time at step 1230. During this time period, the DUT may perform an ADC conversion and compute ADC measurements. When the time period is expired, method 1200 may proceed to step 1240. At step 1240, method 1200 may increase the ADC input voltage $V_{in}$ by one voltage step $V_{step}$. At step 1250, method 1200 may determine whether the ADC input voltage $V_{in}$ reaches the stopping voltage $V_{TestStop}$. If the ADC input voltage is not at the stopping voltage $V_{TestStop}$, method 1200 may proceed to step 1220. Method 1200 may repeat the loop of steps 1220 to 1250 until the ADC input voltage $V_{in}$ reaches the stopping voltage $V_{TestStop}$.

At step 1260, method 1200 may read linearity measurements from the DUT. The measurements may include a maximum code occurrences, a minimum code occurrences, an ADC output code corresponding to the maximum code occurrences, an ADC output code corresponding to the minimum code occurrences, a maximum scaled INL value, a minimum scaled INL value, an ADC output code corresponding to the maximum scaled INL value, and an ADC output code corresponding to the minimum scaled INL value as described in Table 1. In addition, the measurements may further include test data, such as a flag indicating an ADC sample is received with a value outside the test code range dlt.

At step 1270, method 1200 may compute a minimum DNL value, a maximum DNL value, a minimum INL value, and a maximum INL value for the ADC as shown below:

$$dlt = C_{hi} - C_{lo} - 1 \quad \text{Equation (10)}$$

$$h_{avg} = \frac{h_{sum}}{dlt}$$

$$DNL_{min} = \frac{h_{min}}{h_{avg}} - 1.0$$

$$DNL_{max} = \frac{h_{max}}{h_{avg}} - 1.0$$

$$INL_{min} = \frac{INL_{ScaledMin}}{h_{sum}}$$

$$INL_{max} = \frac{INL_{ScaledMax}}{h_{sum}}$$

Figure 13:
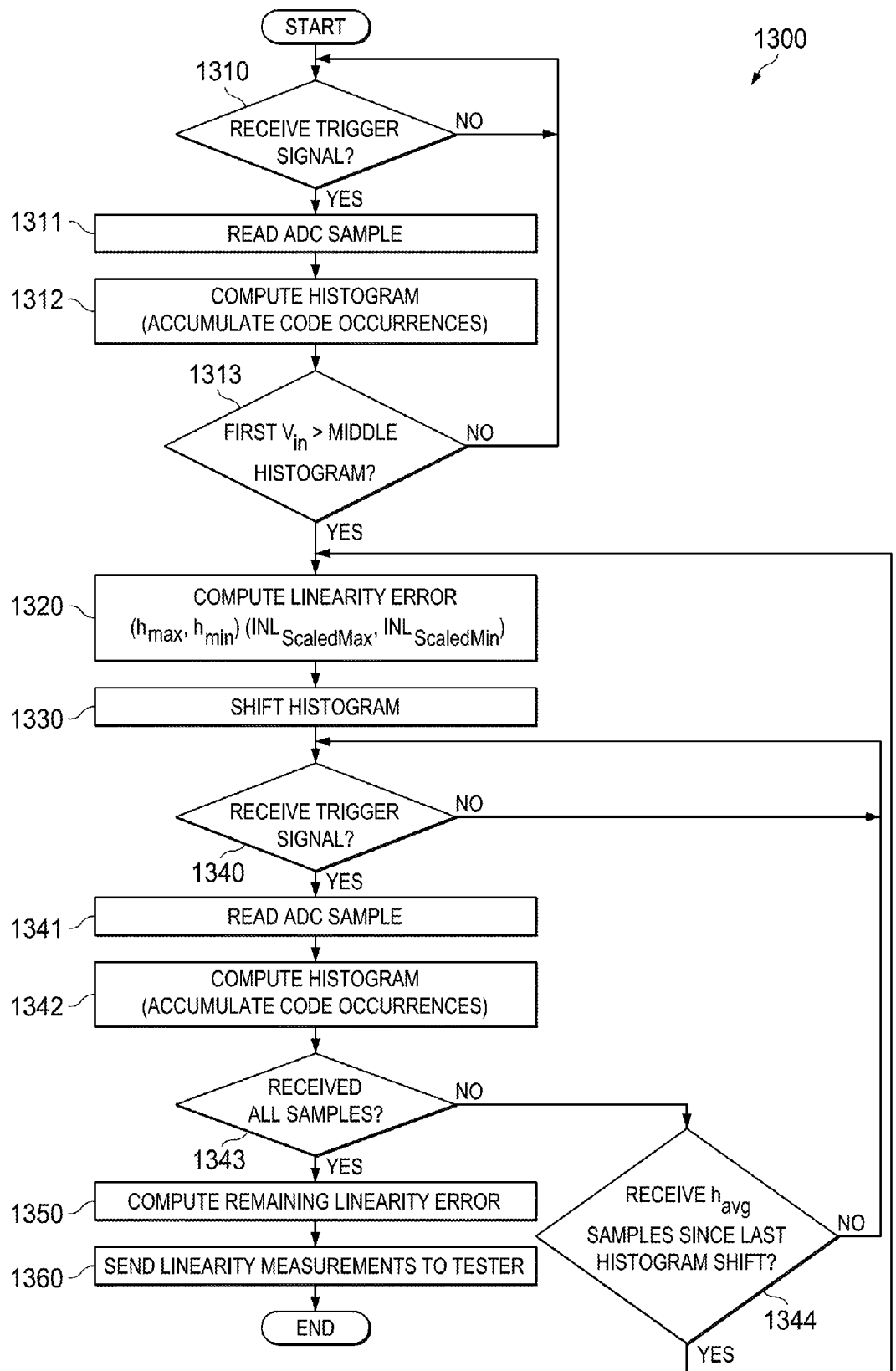
FIG. 13 shows a flowchart of another ADC linearity test method in accordance with various embodiments.

FIG. 13 shows a flowchart of another ADC linearity test method 1300 in accordance with various embodiments. Method 1300 may be implemented on a BIST engine (e.g. BIST engine 322 and 400) positioned in an embedded device (e.g. DUT 320) in a test set up substantially similar to ADC test set up 300. Method 1300 may be employed for measuring linearity parameters for an on-chip ADC (e.g. ADC 321) by applying a moving histogram based method, which may be substantially similar to method 700. Method 1300 may begin after the ADC is calibrated for a starting voltage $V_{TestStart}$ (e.g. at voltage increments count $V_{Idxlo}$) and a stopping voltage $V_{TestStop}$ (e.g. at voltage increment count $V_{Idxhi}$) and a total code occurrences $h_{sum}$ is estimated, for example, by employing method 1000.

At step 1310, method 1300 may wait for a trigger signal from a tester (e.g. tester 310), where the trigger signal may indicate an input voltage (e.g. voltage source 311) at the ADC input is increased by a step $V_{step}$. Upon receiving the trigger signal, method 1300 may proceed to step 1311. At step 1311, method 1300 may read an ADC sample. At step 1312, method 1300 may compute a histogram of code occurrences $h[N_{bin}]$ (e.g. histogram 710) for a small range (e.g. $N_{bin}$=about eight to thirty two) of ADC output codes, where each bin of the histogram may correspond to one ADC code. At step 1313, method 1300 may determine whether the voltage source is at a voltage that may produce an ADC output code corresponding to a bin at about middle of the histogram. If the voltage does not correspond to about the middle bin, method 1300 may return to step 1310 and repeat the loop of steps 1310 to 1313. Otherwise, method 1300 may proceed to step 1320 when the voltage $V_{in}$ correspond to about the middle bin. It should be noted that when the voltage $V_{in}$ corresponds to about the middle bin, method 1300 may already have received all ADC codes $C_{h0}$ corresponding to the lowest bin h[0] (e.g. lowest bin is full).

At step 1320, method 1300 may compute linearity errors for the lowest bin h[0]. Linearity errors may include a maximum code occurrences, a minimum code occurrences, a maximum modified INL value, and a maximum modified INL value. The following pseudo code may be employed for computing the minimum code occurrences $h_{min}$ and the maximum code occurrences $h_{max}$:

if h[0]<$h_{min}$ {
   $h_{min}$=h[0]; // update minimum code occurrences
   $C_{hmin}$=$C_{h0}$; // ADC code with minimum code occurrences
}

```
if h[0]>hmax {
    h_max=h[0]; // update maximum code occurrences
    C_hmax=C_h0; // ADC code with maximum code occur-
        rences
}
```

The modified INL value $INL_{scale}$ for the code $C_{ho}$ that corresponds to the lowest bin h[0] may be computed according to equation (9). The following pseudo code may be employed for computing the maximum modified INL value and minimum modified INL value:

```
if INL_scale<INL_scaledMin {
    INL_scaledMin=INL_scale; // update minimum modified
        INL value
    C_INLmin=C_h0; // ADC code with minimum modified INL
        value
}
if INL_scale>INL_ScaledMax {
    INL_ScaledMin=INL_scale; // update maximum modified
        INL value
    C_INLmax=C_h0; // ADC code with maximum modified
        INL value
}
```

After computing the linearity errors, the lowest bin h[0] may be discarded. Thus, at step 1330, method 1300 may shift the histogram by one ADC code at step 1330. The shifting of the histogram may be substantially similar to method 700.

After shifting the histogram, method 1300 may continue to read ADC sample and update the histogram in steps 1340 to 1342. At step 1340, method 1300 may wait for a trigger signal from the tester. Upon receiving the trigger signal, method 1300 may proceed to step 1341. At step 1341, method 1300 may read an ADC sample. At step 1342, method 1300 may continue to update a number of code occurrences for a bin that corresponds to the ADC sample value. At step 1343, method 1300 may determine whether all ADC samples are received (e.g. according to last voltage increment $V_{Idxhi}$) from the tester. If not all ADC samples are read, method 1300 may continue to step 1344. At step 1344, method 1300 may determine whether $h_{avg}$ samples are received since the last histogram shift. Method 1300 may proceed to step 1320 when $h_{avg}$ samples are received since the last histogram shift. Otherwise, method 1300 may proceed to step 1340.

Returning to step 1343, method 1300 may proceed to step 1350 when all samples are received. At step 1350, method 1300 may compute linearity errors for all bins in $h[N_{bin}]$, where the linearity errors may be computed in a substantially similar mechanism as in step 1320. At step 1360, method 1300 may send linearity measurements to the tester. For example, the measurements may include a maximum code occurrences, a minimum code occurrences, an ADC output code corresponding to the maximum code occurrences, an ADC output code corresponding to the minimum code occurrences, a maximum scaled INL value, a minimum scaled INL value, an ADC output code corresponding to the maximum scaled INL value, and an ADC output code corresponding to the minimum scaled INL value as described in Table 1.

It should be noted that when the input voltage is close to the starting voltage $V_{TestStart}$, the ADC may produce ADC codes that are lower than the lowest code $C_{lo}$ in the test code span dlt due to noise or run-to-run variations. Thus, method 1300 may detect codes that lie outside the code range (e.g. outliers) and may adjust the total code occurrences $h_{sum}$ accordingly for more accurate INL measurements with the moving histogram based method. In addition, method 1300 may set a flag to indicate an error when an ADC code is outside the code range dlt when the voltage is not close to $V_{TestStart}$ or $V_{TestStop}$.

Figure 14:
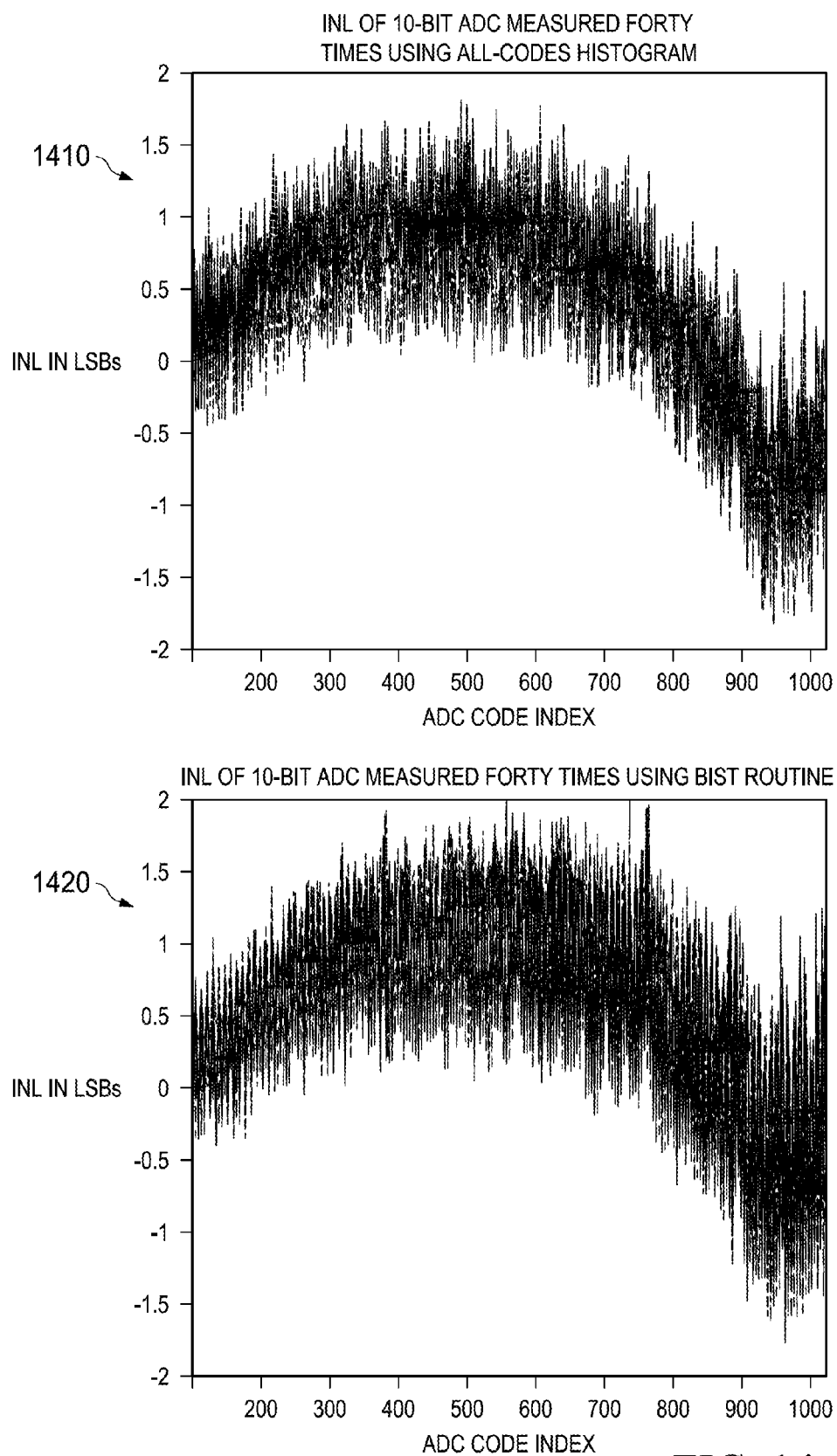
FIG. 14 shows two graphs of ADC INL measurements comparing an all-code histogram based method and a moving histogram based method in accordance with various embodiments.

FIG. 14 shows two graphs of ADC INL measurements comparing an all-code histogram based method versus a moving histogram based method in accordance with various embodiments. The x-axis may represent ADC code index and the y-axis may represent INL values in units of LSBs. Graph 1410 are INL values computed from an all-code histogram based method and graph 1420 are INL values computed from a moving histogram based method (e.g. method 1000, 1100, 1200, 1300). As can be observed, INL values computed from the moving histogram based method are comparable to the INL values computed from the all-code histogram based method.

The above discussion is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for testing linearity of an Analog-to-Digital Converter (ADC), comprising:
    receiving a trigger signal indicating an ADC input voltage step adjustment;
    reading an ADC output sample upon receiving the trigger signal, wherein the ADC output sample has a value range of N integer values that correspond to N discrete ADC output codes;
    computing a histogram of code occurrences for M consecutive ADC output codes, wherein the histogram comprises M number of bins corresponding to the M consecutive ADC output codes, and wherein M is less than N;
    updating a Differential Non Linearity (DNL) value and an Integral Non Linearity (INL) value according to the histogram at an interval of K number of ADC output sample readings; and
    shifting the histogram by one ADC output code after updating the DNL and the INL values.

2. The method of claim 1, wherein the voltage step adjustment is a constant increment for each adjustment, and wherein the interval of K number of ADC output sample readings corresponds to an average number of occurrences for each of the N ADC output codes.

3. The method of claim 1, wherein shifting the histogram begins when the ADC sample value equals to an ADC output code that is about M/2 codes greater than a minimum code in the N ADC output codes.

4. The method of claim 1, wherein updating the DNL value comprises:
    comparing a bin value of a lowest histogram bin to a minimum code occurrences and a maximum code occurrences, wherein the bin value is a number of code occurrences for a current ADC output code that corresponds to the lowest histogram bin;
    setting the minimum code occurrences to the bin value when the bin value is less than the minimum code occurrences;
    setting a minimum DNL ADC code to the current ADC output code when the bin value is less than the minimum code occurrences;
    setting the maximum code occurrences to the bin value when the bin value is greater than the maximum code occurrences; and
    setting a maximum DNL ADC code to the current ADC output code when the bin value is greater than the maximum code occurrences.

5. The method of claim 1, wherein the DNL and the INL values are updated for D number of ADC output codes beginning at a first ADC output code and stopping at a second ADC output code, wherein the first ADC output code is a next minimum code, greater than a minimum code of the N ADC output codes, wherein the second ADC output code is a next maximum code, less than a maximum code of the N ADC output codes, and wherein D is equal to a value of N−2.

6. The method of claim 5 further comprising determining a total number of code occurrences over the D number of ADC output codes prior to computing the histogram, wherein determining the total number of code occurrences comprises:
counting a number of voltage step adjustments by employing a counter;
recording a first counter value when a first previous ADC sample value equals to a minimum code of the N ADC output codes and a first current ADC sample value equals to the next minimum code, greater than the minimum code;
recording a second counter value when a second previous ADC sample value equals to the next maximum code, less than a maximum code of the N ADC output codes and a second current ADC sample value equals to the maximum code;
setting the total number of code occurrences by computing a difference between the first counter value and the second counter value; and
reporting the first counter value and the second counter value.

7. The method of claim 6, wherein the INL value is updated after determining the total number of code occurrences, and wherein updating the INL value comprises:
computing a scaled DNL value for a current ADC output code that corresponds to a lowest histogram bin according to an equation:

$$DNL_{h_{sum}} = h[0] \times D - h_{sum}$$

where $h_{sum}$ is the total number of code occurrences and $h[0]$ is a number of code occurrences for the current ADC output code;
computing a current scaled INL value for the current ADC output code by adding the scaled DNL value to a previous scaled INL value;
comparing the current scaled INL value to a minimum scaled INL value and a maximum scaled INL value;
setting the minimum scaled INL value to the current scaled INL value when the current scaled INL value is less than the minimum scaled INL value;
setting a minimum INL ADC code to the current ADC output code when the current scaled INL value is less than the minimum scaled INL value;
setting the maximum scaled INL value to the current scaled INL value when the current scaled INL value is greater than the maximum scaled INL value; and
setting a maximum INL ADC code to the current ADC output code when the current scaled INL value is greater than the maximum scaled INL value.

8. The method of claim 5 further comprises determining a fail result for the ADC when the received ADC sample value is less than the first ADC output code or greater than the second ADC output code.

9. The method of claim 6 further comprises decrementing the total number of code occurrences by one when the received ADC sample value is less than the first ADC output code when a previous ADC sample value is equal to the first ADC output code.

10. The method of claim 5 further comprises sending a test report after updating the INL and the DNL values for the D number of ADC output codes, wherein the test report comprises:
a maximum code occurrences;
a minimum code occurrences;
a first ADC output code corresponding to the maximum code occurrences;
a second ADC output code corresponding to the minimum code occurrences;
a maximum INL value scaled by a total number of code occurrences;
a minimum INL value scaled by a total number of code occurrences;
a third ADC output code corresponding to the maximum scaled INL value;
a fourth ADC output code corresponding to the minimum scaled INL value; and
the total number of code occurrences for the D number of ADC output codes.

11. A non-transitory, computer-readable storage device comprising computer executable instructions that, when executed by a processor, cause the processor to:
detect a trigger event that indicates an analog-to-digital converter (ADC) voltage step increment;
read an ADC output sample code upon detecting the event, wherein the ADC output sample has a value in a range of N integer values that correspond to N discrete ADC output codes;
compute a histogram of code occurrences for M consecutive ADC output codes, wherein the histogram comprise M number of bins corresponding to the M consecutive ADC output codes, and wherein M is less than N;
update a maximum Differential Non Linearity (DNL) value, a minimum DNL value, a maximum Integral Non Linearity (INL) value, and a minimum INL value for the ADC according to the histogram at an interval of K number of ADC output sample readings; and
shift the histogram by one ADC output code after updating the maximum DNL value, the minimum DNL value, the maximum INL value, and the minimum INL value.

12. The computer-storage readable device of claim 11, wherein the voltage step increment is constant for each increment, and wherein the interval of K number of ADC output sample readings corresponds to an average number of occurrences for each of the N ADC output codes.

13. The computer-storage readable device of claim 11, wherein shifting the histogram begins when the ADC sample value equals to an ADC output code that is about M/2 codes greater than a minimum code of the N ADC output codes.

14. The computer-storage readable device of claim 11, wherein the maximum and minimum DNL values are updated in terms of a maximum number of code occurrences and a minimum number of code occurrences, and wherein updating the maximum and minimum DNL values comprises:
comparing a bin value of a lowest histogram bin to the minimum code occurrences and the maximum code occurrences, wherein the bin value is a number of code occurrences for a current ADC output code that corresponds to the lowest histogram bin;
setting the minimum code occurrences to the bin value when the bin value is less than the minimum code occurrences;
setting a minimum DNL ADC code to the current ADC output code when the bin value is less than the minimum code occurrences;

setting the maximum code occurrences to the bin value when the bin value is greater than the maximum code occurrences; and setting a maximum DNL ADC code to the current ADC output code when the bin value is greater than the maximum code occurrences.

15. The computer-storage readable device of claim 11, wherein the maximum DNL value, the minimum DNL value, the maximum INL value, and the minimum INL value are computed for D number of ADC output codes beginning at a first ADC output code and stopping at a second ADC output code, wherein the first ADC output code is a next minimum code, greater than a minimum code of the N ADC output codes, wherein the second ADC output code is a next maximum code, less than a maximum code of the N ADC output codes, and wherein D is equal to a value of N−2.

16. The computer-storage readable device of claim 15, wherein the instructions further cause the processor to determine a total number of code occurrences by:

incrementing a counter by one after receiving each trigger event;

recording a first counter value when a previous ADC sample value equals to a minimum code of the N discrete ADC output codes and a current ADC sample value equals to a next minimum code, greater than the minimum code;

recording a second counter value when a previous ADC sample value equals to a next maximum code, less than a maximum code of the N discrete ADC output codes and a current ADC sample value equals to the maximum code;

setting the total number of code occurrences by computing a difference between the first counter value and the second counter value; and generating an output comprising the first counter value and the second counter value.

17. The computer-storage readable device of claim 16, wherein the INL value is updated after determining the total number of code occurrences, and wherein updating the maximum and minimum INL values comprises:

computing a scaled DNL value for a current ADC output code corresponding to a lowest histogram bin according to an equation:

$$DNL_{h_{sum}} = h[0] \times D - h_{sum}$$

where $h_{sum}$ is a total number of code occurrences and $h[0]$ is a number of code occurrences for the current ADC output code;

computing a current scaled INL value for the current ADC output code by adding the scaled DNL value to a previous scaled INL value;

comparing the current scaled INL value to a minimum scaled INL value and a maximum scaled INL value;

setting the minimum scaled INL value to the current scaled INL value when the current scaled INL value is less than the minimum scaled INL value;

setting a minimum INL ADC code to the current ADC output code when the current scaled INL value is less than the minimum scaled INL value;

setting the maximum scaled INL value to the current scaled INL value when the current scaled INL value is greater than the maximum scaled INL value; and setting a maximum INL ADC code to the current ADC output code when the current scaled INL value is greater than the maximum scaled INL value.

18. An apparatus, comprising:

an analog-to-digital converter (ADC) configured to convert an analog input signal into N discrete ADC output codes;

a memory to include a histogram comprising M number of bins that store number of occurrences for M consecutive ADC output codes, wherein each bin corresponds to one of the M ADC output codes, and wherein M is less than N;

a first interface configured to receive a trigger signal that indicates a voltage step increment at the ADC input, wherein an average of K number of received triggered signals corresponds to an ADC output code transition; and a processor coupled to the ADC, the memory, and the first interface and configured to:

read an ADC output sample upon receiving the trigger signal;

compute the histogram by incrementing a number of occurrences in a bin corresponding to a value of the ADC sample;

update a maximum code occurrences, a minimum code occurrences, a maximum Integral Non Linearity (INL) value, and a minimum INL according to the histogram at an interval of K ADC output sample readings, wherein the maximum code occurrences is proportional to a maximum Differential Non Linearity (DNL) value, and wherein the minimum code occurrences is proportional to a minimum DNL value; and shift the histogram by one ADC output code after updating the maximum code occurrences, the minimum code occurrences, the maximum INL value, and the minimum INL value.

19. The apparatus of claim 18, wherein the maximum code occurrences, the minimum code occurrences, the maximum INL value, and the minimum INL value are updated for D number of ADC output codes beginning at a first ADC output code that is a next minimum code, greater than a minimum code of the N ADC output codes and stopping at a second ADC output code that is a next maximum code, less than a maximum code of the N ADC output codes, and wherein D is equal to a value of N−2.

20. The apparatus of claim 18, wherein the processor is configured to update the maximum code occurrences and the minimum code occurrences by:

comparing a bin value of a lowest histogram bin to a minimum code occurrences and a maximum code occurrences;

setting the minimum code occurrences to the bin value when the bin value is less than the minimum code occurrences;

setting a minimum DNL ADC code to an ADC output code that corresponds to the lowest histogram bin when the bin value is less than the minimum code occurrences;

setting the maximum code occurrences to the bin value when the bin value is greater than the maximum code occurrences; and setting a maximum DNL ADC code to the ADC output code that corresponds to the lowest histogram bin when the bin value is greater than the maximum code occurrences.

21. The apparatus of claim 18, wherein the processor is further configured to:

increment a counter by one after receiving each trigger event;

record a first counter value when a previous ADC sample value corresponds to a minimum code of the N discrete ADC output codes and a current ADC sample value corresponds to a next minimum code, greater than the minimum code;

record a second counter value when a previous ADC sample value corresponds to a next maximum code, less than a maximum code of the N discrete ADC output codes and a current ADC sample value corresponds to the maximum code; and determine the total number of code occurrences by computing a difference between the first counter value and the second counter value, and wherein the apparatus further comprises a second interface configured to send the first counter value and the second counter value.

22. The apparatus of claim 18, wherein the processor is configured to update the maximum and minimum INL values by:

computing a scaled DNL value for a current ADC output code corresponding to a lowest histogram bin according to an equation:

$$DNL_{hsum} = h[0] \times D - h_{sum}$$

where $h_{sum}$ is a total number of code occurrences and $h[0]$ is a number of code occurrences for the current ADC output code;

computing a current scaled INL value for the current ADC output code by adding the scaled DNL value to a previous scaled INL value;

comparing the current scaled INL value to a minimum scaled INL value and a maximum scaled INL value;

setting the minimum scaled INL value to the current scaled INL value and a minimum INL ADC code to the current ADC output code when the current scaled INL value is less than the minimum scaled INL value; and setting the maximum scaled INL value to the current scaled INL value and a maximum INL ADC code to the current ADC output code when the current scaled INL value is greater than the maximum scaled INL value.

23. The apparatus of claim 18 further comprises a second interface configured to send the maximum code occurrences, the minimum code occurrences, the maximum INL value, and the minimum INL value.

24. A non-transitory, computer-readable storage device comprising computer executable instructions that, when executed by a processor, cause the processor to:

set a first control code to instruct a voltage step increment;
set a second control code to indicate the voltage step increment;
read an analog-to-digital converter (ADC) measurement report comprising a maximum code occurrences, a minimum code occurrences, a maximum scaled Integral Non Linearity (INL) value, and a minimum scaled INL value;
compute a maximum Differential Non Linearity (DNL) value according to an equation:

$$\text{maximum } DNL \text{ value} = \frac{\text{maximum code occurrences}}{h_{sum}} \times dlt - 1.0$$

wherein $h_{sum}$ is a total number of code occurrences between a first ADC output code and a second ADC output code, and wherein dlt is a difference between the first ADC output code and the second ADC output code plus one;

compute a minimum DNL value according to an equation:

$$\text{maximum } DNL \text{ value} = \frac{\text{minimum code occurrences}}{h_{sum}} \times dlt - 1.0;$$

compute a maximum INL value by dividing the maximum scaled INL value by the total number of code occurrences; and compute a minimum INL value by dividing the minimum scaled INL value by the total number of code occurrences.

25. The computer-storage readable device of claim 24, wherein the instructions further cause the processor to:

read a first number of voltage step increments and a second number of voltage step increments, wherein the first number of voltage step increments corresponds to a first ADC code transition from a minimum ADC output code to the first ADC output code, wherein the second number of voltage step increments corresponds to a second ADC code transition from the second ADC output code to a maximum ADC output code, and wherein the total number of code occurrences is a difference between the first number of voltage step increments and the second number of voltage step increments.

* * * * *